US012660589B2

(12) United States Patent
Lin et al.

(10) Patent No.:  US 12,660,589 B2
(45) Date of Patent:  Jun. 16, 2026

(54) SEMICONDUCTOR DEVICE INCLUDING POWER GRID STRUCTURE AND METHOD OF FABRICATING

(71) Applicant: TAIWAN SEMICONDUCTOR MANUFACTURING COMPANY, LTD., Hsinchu (TW)

(72) Inventors: Chin-Shen Lin, Hsinchu (TW); Ren-Zheng Liao, Hsinchu (TW); Hao-Tien Kan, Hsinchu (TW); Yung-Fong Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 424 days.

(21) Appl. No.: 18/325,828

(22) Filed: May 30, 2023

(65) Prior Publication Data

US 2024/0258200 A1      Aug. 1, 2024

Related U.S. Application Data

(60) Provisional application No. 63/481,870, filed on Jan. 27, 2023.

(51) Int. Cl.
H10W 20/20 (2026.01)
H10W 70/05 (2026.01)
(52) U.S. Cl.
CPC ......... H10W 20/20 (2026.01); H10W 70/095 (2026.01)

(58) Field of Classification Search
CPC ... H01L 23/481; H01L 21/486; H01L 23/528; H01L 23/5286; H01L 23/5226; H01L 23/5283
See application file for complete search history.

(56) References Cited

U.S. PATENT DOCUMENTS

2018/0145030 A1*    5/2018    Beyne ............... H01L 21/76898

FOREIGN PATENT DOCUMENTS

| KR | 20140085742 | 7/2014 |
|---|---|---|
| KR | 20200133630 | 11/2020 |
| KR | 20210033396 | 3/2021 |
| TW | 202201703 | 1/2022 |
| TW | 20224095 | 10/2022 |

* cited by examiner

*Primary Examiner* — Herve-Louis Y Assouman
(74) *Attorney, Agent, or Firm* — Hauptman Ham, LLP

(57)                    ABSTRACT
A semiconductor devices includes a substrate, a power grid structure, and a through via penetrating the substrate. The power grid structure includes: first and second rails extending along a first direction, a conductive wire, a third rail, a conductive via, and a connecting member. The conductive wire is between the first and second rails, and extends along the first direction. The third rail is below the first rail, the second rail and the conductive wire, and extends along a second direction perpendicular to the first direction. The conductive via is between and electrically couples the conductive wire to the third rail. The connecting member is between and electrically couples the first rail to the conductive wire. The through via extends through the substrate and along a third direction perpendicular to the first direction and the second direction. The through via is disposed on and coupled to the conductive wire.

20 Claims, 19 Drawing Sheets

100

40A

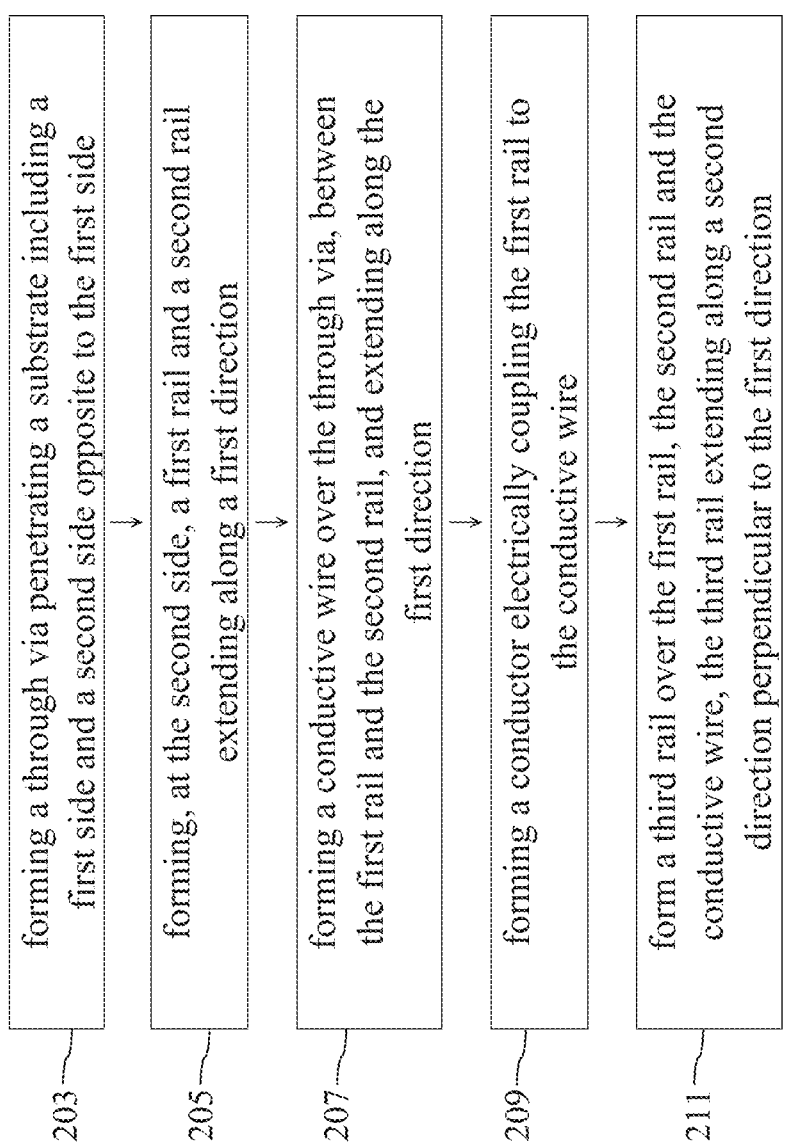

forming a through via penetrating a substrate including a first side and a second side opposite to the first side forming, at the second side, a first rail and a second rail extending along a first direction forming a conductive wire over the through via, between the first rail and the second rail, and extending along the first direction forming a conductor electrically coupling the first rail to the conductive wire form a third rail over the first rail, the second rail and the conductive wire, the third rail extending along a second direction perpendicular to the first direction

SEMICONDUCTOR DEVICE INCLUDING POWER GRID STRUCTURE AND METHOD OF FABRICATING

CROSS-REFERENCE TO RELATED APPLICATIONS

This application claims the benefit of U.S. Provisional Application No. 63/481,870, filed Jan. 27, 2023, the entire disclosure of which is incorporated by reference herein.

BACKGROUND

The layout of an integrated circuit (IC) typically includes circuit modules and interconnect lines. The circuit modules include geometric arrangements of electronic or circuit components with signal pins. The interconnect lines connect the signal pins of the circuit modules. A signal net is typically defined as a collection of signal pins that need to be connected.

To create layouts of an IC, an electronic design automation (EDA) operation is usually executed by design engineers. The EDA operation provides sets of computer-based tools for creating and analyzing IC design layouts. An EDA tool is a signal wire router that defines routes for interconnect lines that connect the signal pins of a signal net. Using the EDA operation, the IC layout can be generated or edited more quickly and efficiently. However, the design of the IC layout needs to follow certain design rules. Such design rules may impose a geometric constraint on the IC to ensure that its design functions properly and reliably, and that the design can be produced with acceptable yield.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 13 is a flow diagram showing a method of fabricating a stack structure, in accordance with some embodiments of the present disclosure.

DETAILED DESCRIPTION OF THE DISCLOSURE

Figure 1:
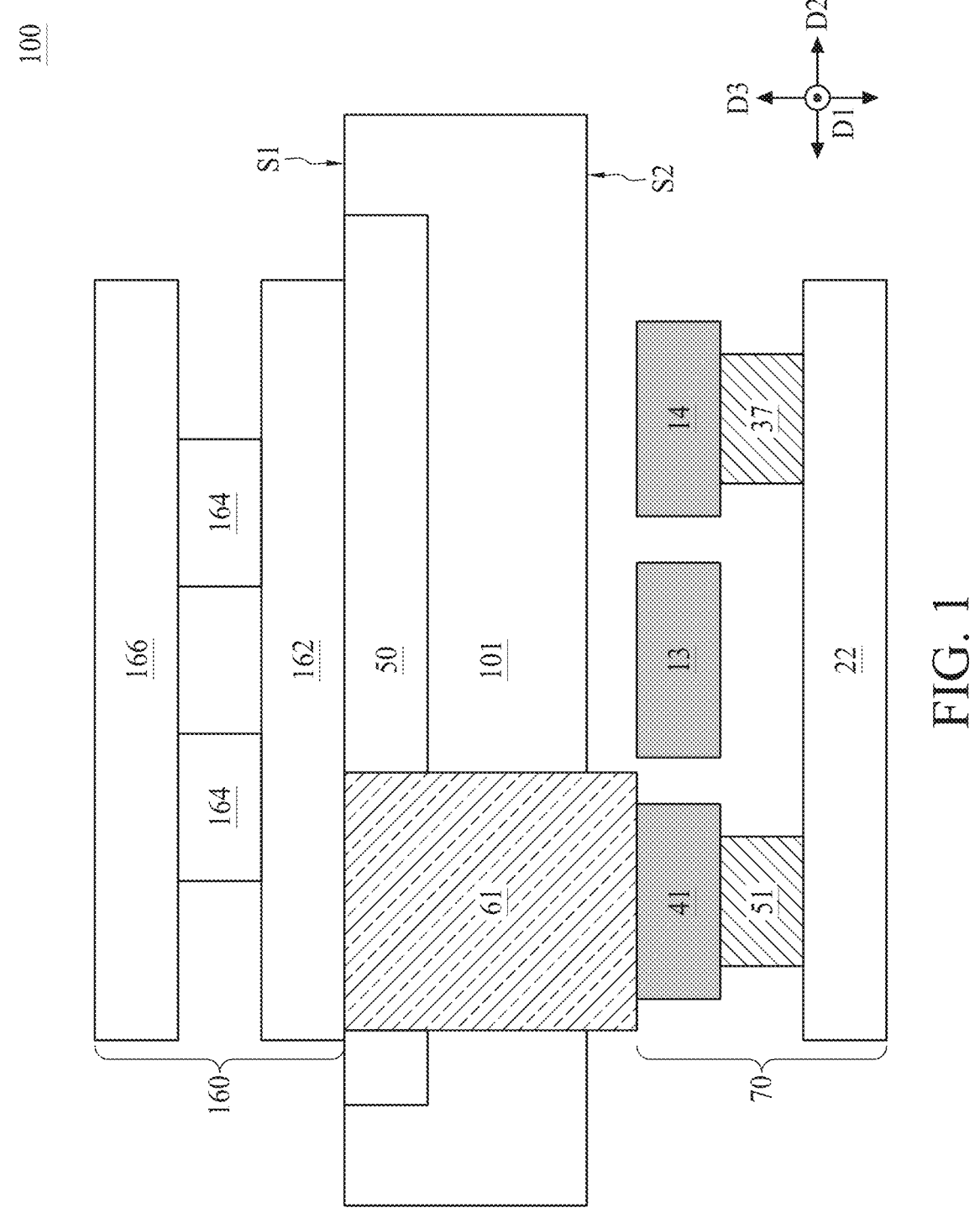
FIG. 1 is a schematic cross-sectional view of a semiconductor device including a power grid structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass orientations of the device in use or operation in some embodiments different from the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some embodiments, an IC includes a power grid (PG) structure that provides power and ground to each electronic and circuit component of the IC. The electronic or circuit IC component has a power pin and a ground pin connected to the power grid structure. Power grid structure components include, but are not limited to, strips, rails or vias, which have a certain dimension to meet design specifications or rules. The design specifications or rules of the power grid structure are met in order for the power grid structure to be acceptable for use in the IC. However, some power grid components potentially compete with signal wiring since the power grid components occupy areas that the signal wiring could otherwise use.

Figure 2:
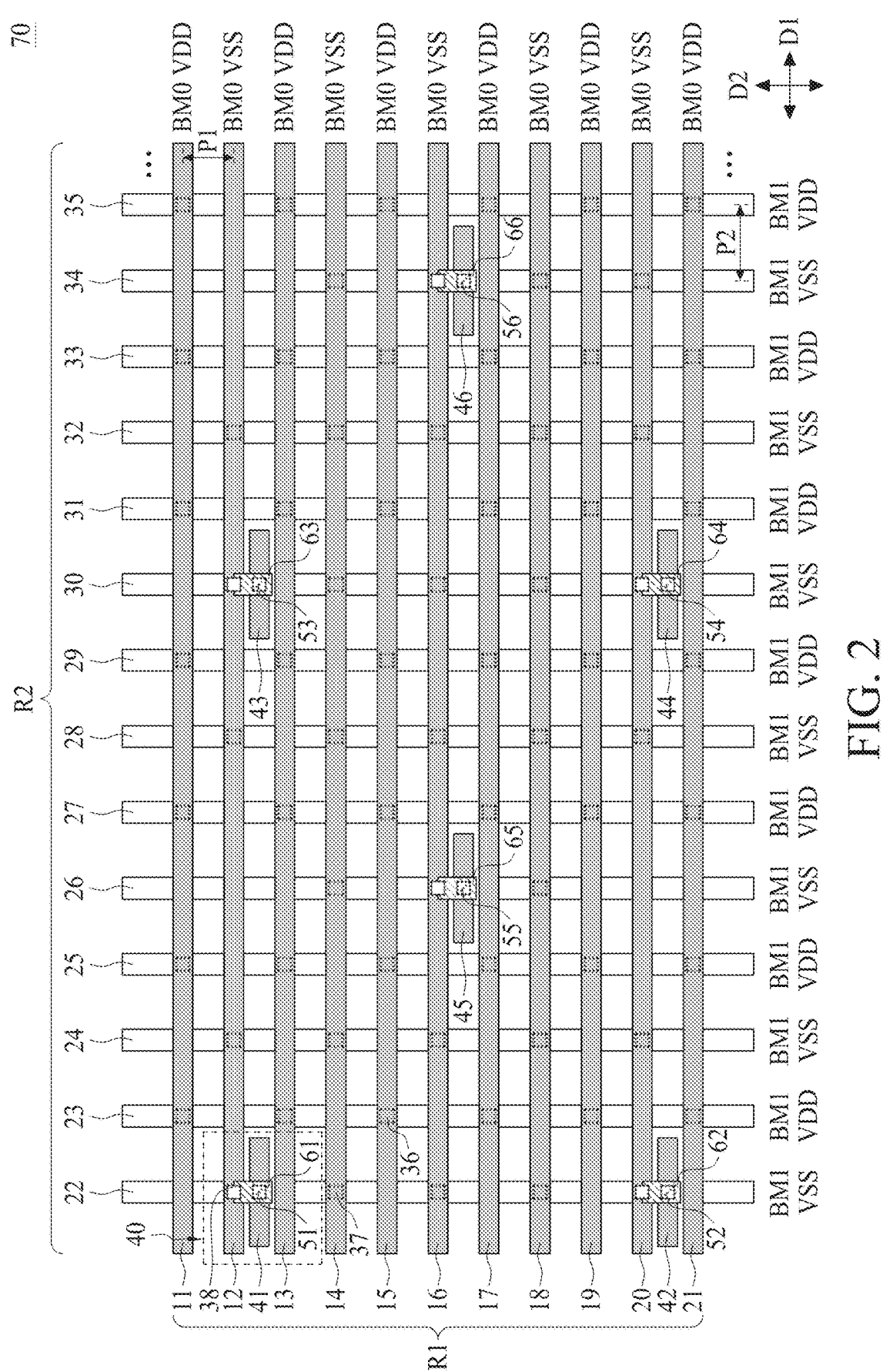
FIG. 2 is a schematic top view including the power grid structure of the semiconductor device in FIG. 1, in accordance with some embodiments of the present disclosure.

FIG. 1 is a schematic cross-sectional view of a semiconductor device 100 including a power grid structure 70, in accordance with some embodiments of the present disclosure. FIG. 2 is a schematic top view including the power grid structure 70 in FIG. 1, in accordance with some embodiments of the present disclosure. Referring to FIG. 1, the semiconductor device 100 includes a substrate 101. Example materials of the substrate 101 include, but are not limited to, silicon (Si), other group III, group IV, and/or group V elements, such as germanium (Ge), gallium (Ga), arsenic (As), or combinations thereof. In some embodiments, the substrate 101 is a bulk substrate or silicon-on-insulator (SOI) substrate.

The substrate 101 has a first surface S1 on a top side (or first side) of the substrate 101 and a second surface S2 on a bottom side (or second side) of the substrate 101. One or more active regions 50 are formed in or on the first surface S1 of the substrate 101. Although not specifically illustrated in FIG. 1, various active elements such as transistors are formed in the active region 50, in one or more embodiments. Example transistors include, but are not limited to, planar transistors, fin-type transistors or gate-all-around (GAA) transistors. Various passive elements such as, for example, resistors, capacitors, and/or inductors are also formed on the first surface S1, in some embodiments. Such electrical elements constitute a plurality of cells such as logic cells or memory cells. An interconnect structure 160 is disposed over and electrically coupled to the active region 50. The interconnect structure 160 includes multiple layers (e.g., metal layers) of conductive lines 162 and 166 connected by conductive contacts or vias 164. The interconnect structure 160 is configured for signal routing for the electrical elements in the active region 50. In the interconnect structure 160, the lowermost metal layer immediately over the active region 50 is an M0 (metal-zero) layer, a next metal layer immediately over the M0 layer is an M1 layer, a next metal layer immediately over the M1 layer is an M2 layer, or the like. Conductive patterns (or conductive lines) in the M0 layer are referred to as M0 conductive patterns, conductive patterns in the M1 layer are referred to as M1 conductive patterns, or the like. A via layer VIAn is arranged between and electrically couple the Mn layer and the Mn+1 layer, where n is an integer from zero and up. For example, a via-zero (VIA0) layer is the lowermost via layer which is arranged between and electrically couple the M0 layer and the M1 layer. Other via layers are VIA1, VIA2, or the like. In the example configuration in FIG. 1, the conductive line 162 is an example of a conductive pattern in the M0 layer, the contacts 164 are examples of vias in the VIA0 layer, and the conductive line 166 is an example of a conductive pattern in the M1 layer. The interconnect structure 160 is on the top side or front side of the substrate 101, and is sometimes referred to as the front side interconnect structure 160. The semiconductor device 100 further comprises a back side interconnect structure comprising the power grid structure 70. The back side interconnect structure comprises a plurality of back side metal layers and a plurality of back side via layers arranged alternatingly a thickness direction of the substrate 101. The back side metal layers and back side via layers of the back side interconnect structure are configured to supply power and/or signals from external circuitry to various elements or circuits of the semiconductor device 100 on the front side. The back side metal layer immediately adjacent the back side of the substrate 101 is a back side M0 (BM0) layer, a next back side metal layer is a back side M1 (BM1) layer, or the like. A back side via layer BVIAn is arranged between and electrically couples the BMn layer and the BMn+1 layer, where n is an integer from zero and up. For example, a via layer BVIA0 is the back side via layer arranged between and electrically couples the BM0 layer and the BM1 layer. Other back side via layers are BVIA1, BVIA2, or the like. For simplicity, all metal layers and via layers in the interconnect structure 160 and the back side interconnect structure are not fully illustrated.

Referring to FIGS. 1 and 2, the power grid structure 70 is disposed over the second surface S2. The power grid structure 70 is opposite to the active region 50 with respect to the substrate 101. The power grid structure 70 is a power delivery network that delivers voltages from a power source (not shown) disposed at, or coupled to the back side interconnect structure on, the second surface S2 of the substrate 101 to the electrical elements on the first surface S1 of the substrate 101. A design of the power grid structure 70 is generated using an electronic design automation (EDA) operation, in one or more embodiments. The power grid structure 70 includes a plurality of power rails arranged in parallel and/or perpendicularly. For example, the power grid structure 70 includes a first group R1 of power rails extending along a first direction D1 and a second group R2 of power rails extending along a second direction D2 perpendicular to the first direction D1. In some embodiments, the first group R1 is at a level of the BM0 layer. In some embodiments, the second group R2 is at a level of the BM1 layer.

In the power grid structure 70, in some embodiments, the first group R1 includes 2 to 128 horizontal power rails (i.e., power rails oriented along the first direction D1) and the second group R2 includes 2 to 128 vertical power rails (i.e., power rails oriented along the second direction D2). FIG. 2 only shows the horizontal powers rails 11 to 21 and the vertical power rails 22 to 35 as an example. In the first group R1, the power rails 11, 13, 15, 17, 19 and 21 are configured to deliver a first voltage such as a power supply voltage (VDD) and are referred to as BM0 VDD rails. In the first group R1, the power rails 12, 14, 16, 18 and 20 are configured to deliver a second voltage such as a ground voltage (VSS) and are referred to as BM0 VSS rails. The BM0 VDD rails 11, 13, 15, 17, 19 and 21 and the BM0 VSS rails 12, 14, 16, 18 and 20 are alternately arranged along the second direction D2 at a first pitch P1. In some embodiments, the first pitch P1 is a cell height (CH). In the second group R2, the power rails 23, 25, 27, 29, 31, 33 and 35 are configured to deliver the power supply voltage (VDD) and are referred to as BM1 VDD rails. In the second group R2, the power rails 22, 24, 26, 28, 30, 32 and 34 are configured to deliver the ground voltage (VSS) and are referred to as BM1 VSS rails. The BM1 VDD rails 23, 25, 27, 29, 31, 33 and 35 and the BM1 VSS rails 22, 24, 26, 28, 30, 32 and 34 are alternately arranged along the first direction D1 at a second pitch P2. In some embodiments, the second pitch P2 is one gate pitch (GP) or one contacted poly pitch (CPP). A dimension of the gate pitch is based on a technology node of the transistors formed in the active region 50.

The power grid structure 70 also includes a plurality of BM0 power rails 41 to 46 shorter than the BM0 VDD and VSS rails 11 to 21. The shorter power rails 41 to 46 are called conductive wires 41 to 46 for distinction. In some embodiments, the first conductive wire 41 is disposed over the BM1 VSS rail 22 and between the BM0 VSS rail 12 and the BM0 VDD rail 13. In some embodiments, the second conductive wire 42 is disposed over the BM1 VSS rail 22 and between the BM0 VSS rail 20 and the BM0 VDD rail 21. In some embodiments, the third conductive wire 43 is disposed over the BM1 VSS rail 30 and between the BM0 VSS rail 12 and the BM0 VDD rail 13. In some embodiments, the fourth conductive wire 44 is disposed over the BM1 VSS rail 30 and between the BM0 VSS rail 20 and the BM0 VDD rail 21. In some embodiments, the fifth conductive wire 45 is disposed over the BM1 VSS rail 26 and between the BM0 VSS rail 16 and the BM0 VDD rail 17, and a sixth conductive wire 46 is disposed over the BM1 VSS rail 34 and between the BM0 VSS rail 16 and the BM0 VDD rail 17.

As shown in FIG. 2, in some embodiments, the second conductive wire 42 is immediately neighboring (or adjacent) to the first conductive wire 41 along the power rail 22. That is, there is no conductive wire between the first conductive wire 41 and the second conductive wire 42 along the power rail 22. In some embodiments, the third conductive wire 43 is immediately neighboring to the first conductive wire 41 along the power rails 12 and 13. That is, there is no conductive wire between the first conductive wire 41 and the third conductive wire 43 along the power rails 12 and 13. In some embodiments, the fourth conductive wire 44 is immediately neighboring to the third conductive wire 43 along the power rail 30. That is, there is no conductive wire between the third conductive wire 43 and the fourth conductive wire 44 along the power rail 30. In some embodiments, the fourth conductive wire 44 is immediately neighboring to the second conductive wire 42 along the power rails 20 and 21. That is, there is no conductive wire between the second conductive wire 42 and the fourth conductive wire 44 along the power rails 20 and 21. In some embodiments, the sixth conductive wire 46 is immediately neighboring to the fifth conductive wire 45 along the power rails 16 and 17. That is, there is no conductive wire between the sixth conductive wire 46 and the fifth conductive wire 45 along the power rails 16 and 17. In at least one embodiment, the fifth conductive wire 45 is inside a quadrilateral having the conductive wires 41 to 44 at the corners. In some embodiments, the fifth conductive wire 45 is disposed at a consistent distance away from each of the first conductive wire 41, the second conductive wire 42, the third conductive wire 43 and the fourth conductive wire 44. That is, distances from each of the conductive wires 41, 42, 43 and 44 to the conductive wire 45 are equal or substantially equal to each other. In some embodiments, the fifth conductive wire 45 is centrally or substantially centrally located among or between the first conductive wire 41, the second conductive wire 42, the third conductive wire 43 and the fourth conductive wire 44 from a top view. That is, the conductive wires 41 to 44 are arranged at the corners of a square or rectangle, and the conductive wire 45 is arranged at the center of the square or rectangle, from the top view.

In some embodiments, the second conductive wire 42, the fifth conductive wire 45 and the third conductive wire 43 are diagonally arranged in the power grid structure 70. That is, the second conductive wire 42, the fifth conductive wire 45 and the third conductive wire 43 are arranged along a straight line diagonal to the first direction D1 or the second direction D2. In some embodiments, the first conductive wire 41, the fifth conductive wire 45 and the fourth conductive wire 44 are diagonally arranged in the power grid structure 70. That is, the first conductive wire 41, the fifth conductive wire 45 and the fourth conductive wire 44 are arranged along another straight line diagonal to the first direction D1 or the second direction D2.

In some embodiments, the semiconductor device 100 includes a plurality of through vias 61 to 66 that penetrate the substrate 101. FIG. 1 shows the first through via 61 penetrating the substrate 101 as an example. The through vias 61 to 66 extend from the second surface S2 to the first surface S1 and along the third direction D3 (which is sometimes called the thickness direction D3 of the substrate 101). The thickness direction D3 is both perpendicular to both the first direction D1 and the second direction D2. The through vias 61 to 66 pass through the active region 50 and several layers between the active region 50 and the interconnect structure 160, in one or more embodiments.

As shown in FIG. 2, in some embodiments, the through vias 61 to 66 are correspondingly disposed on, and coupled to, the conductive wires 41 to 46. In some embodiments, when viewed from the third direction D3, the first through via 61 is vertically aligned with, or overlaps, an intersection of the first conductive wire 41 and the BM1 VSS rail 22, the second through via 62 is vertically aligned with an intersection of the second conductive wire 42 and the BM1 VSS rail 22, the third through via 63 is vertically aligned with an intersection of the third conductive wire 43 and the BM1 VSS rail 30, the fourth through via 64 is vertically aligned with an intersection of the fourth conductive wire 44 and the BM1 VSS rail 30, the fifth through via 65 is vertically aligned with an intersection of the fifth conductive wire 45 and the BM1 VSS rail 26, and the sixth through via 66 is vertically aligned with an intersection of the sixth conductive wire 46 and the BM1 VSS rail 34. The second through via 62 is immediately neighboring (or adjacent) to the first through via 61 along the power rail 22. That is, there is no other through via between the first through via 61 and the second through via 62 along the power rail 22. The third through via 63 is immediately neighboring to the first through via 61 along the power rails 12 and 13. That is, there is no other through via between the first through via 61 and third through via 63 along the power rails 12 and 13. Similarly, the fourth through via 64 is immediately neighboring to the second through via 62 along the power rails 20 and 21, the sixth through via 66 is immediately neighboring to the fifth through via 65 along the power rails 16 and 17, and the fourth through via 64 is immediately neighboring to the third through via 63 along the power rail 30.

In at least one embodiment, the fifth through via 65 is inside a quadrilateral having the through vias 61 to 64 at the corners. In some embodiments, the through via 65 is disposed at a consistent distance away from each of the through vias 61, 62, 63 and 64. That is, the distances from each of the through vias 61, 62, 63 and 64 to the through via 65 are equal or substantially equal to each other. In some embodiments, the through via 65 is centrally or substantially centrally located between the through vias 61, 62, 63 and 64 from a top view. That is, the through vias 61 to 64 are arranged at the corners of a square or rectangle, and the fifth through via 65 is arranged at the center of the square or rectangle, from the top view. In some embodiments, the through vias 63, 64, 65, 66 are at corners of a rhombus. In some embodiments, a first distance between two immediately neighboring through vias along the first direction D1, for example the through vias 61 and 63, is between 4 and 200 times the second pitch P2. In some embodiments, the second pitch P2 is several nanometers (nm). In some embodiments, a second distance between two immediately neighboring through vias along the second direction D2, for example the through vias 61 and 62, is between 4 and 10 cell heights. In some embodiments, a cell height is between 100 and 300 nm, and the second distance is between 400 nm and 3000 nm.

In some embodiments, the second through via 62, the fifth through via 65 and the third through via 63 are diagonally arranged in the semiconductor device 100 in a top view. That is, the second through via 62, the fifth through via 65 and the third through via 63 are arranged along a straight line diagonal to the first direction D1 or the second direction D2. In some embodiments, the first through via 61, the fifth through via 65 and the fourth through via 64 are diagonally arranged in the semiconductor device 100 in the top view. That is, the first through via 61, the fifth through via 65 and the fourth through via 64 are arranged along another straight line diagonal to the first direction D1 or the second direction D2. In some embodiments, the through vias 61 to 66 electrically couple the power grid structure 70 to the interconnect structure 160. The through vias 61 to 66 are configured as transmission paths for signals, power and/or grounding between electrical elements over the first surface S1 and between electrical elements over the second surface S2, in one or more embodiments. In some cases, the through vias 61 to 66 are referred to as feedthrough vias (FTVs).

Figure 3:
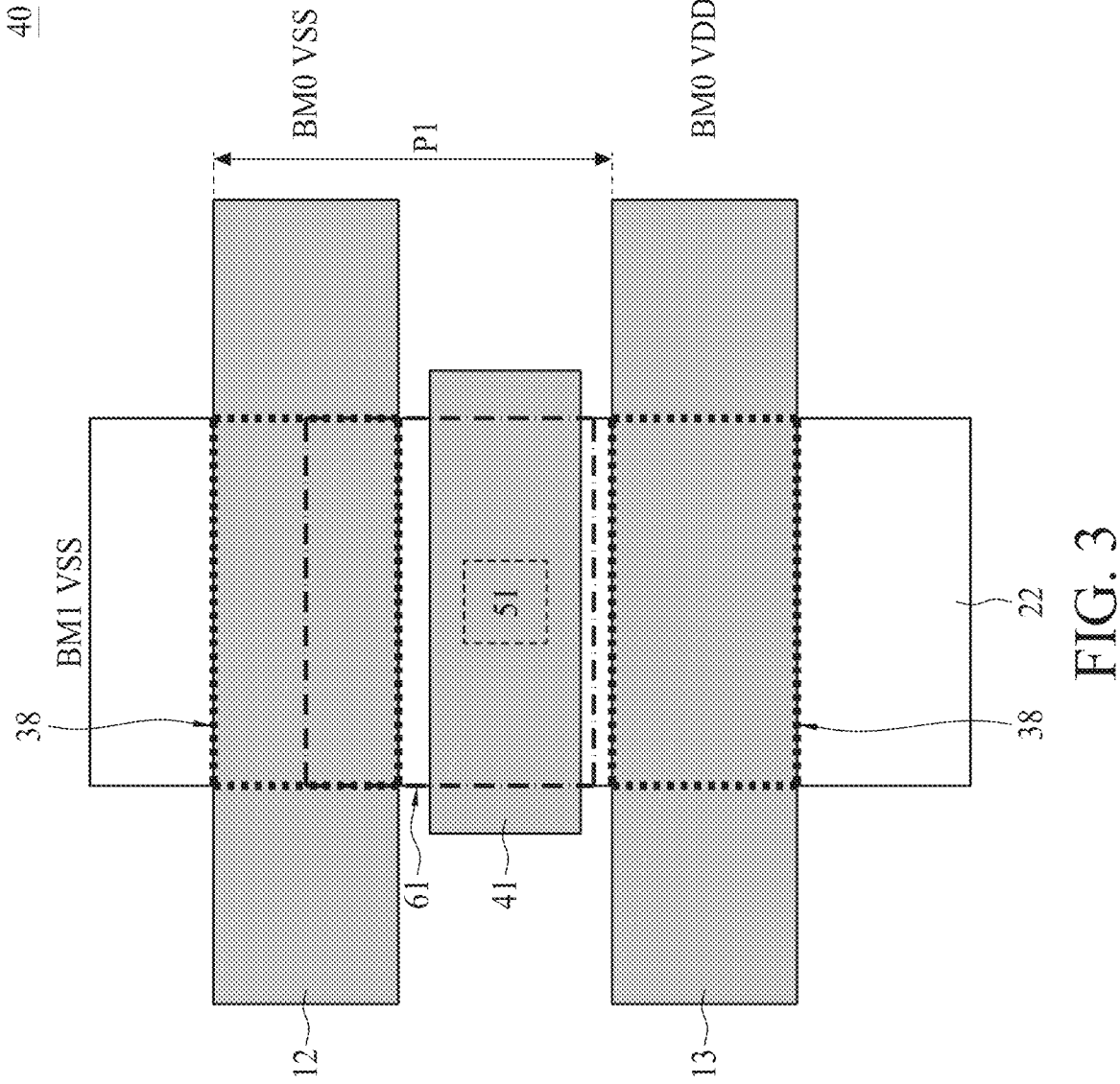
FIG. 3 is an enlarged view of a stack structure of the power grid structure in FIG. 2, in accordance with some embodiments of the present disclosure.
Figure 4:
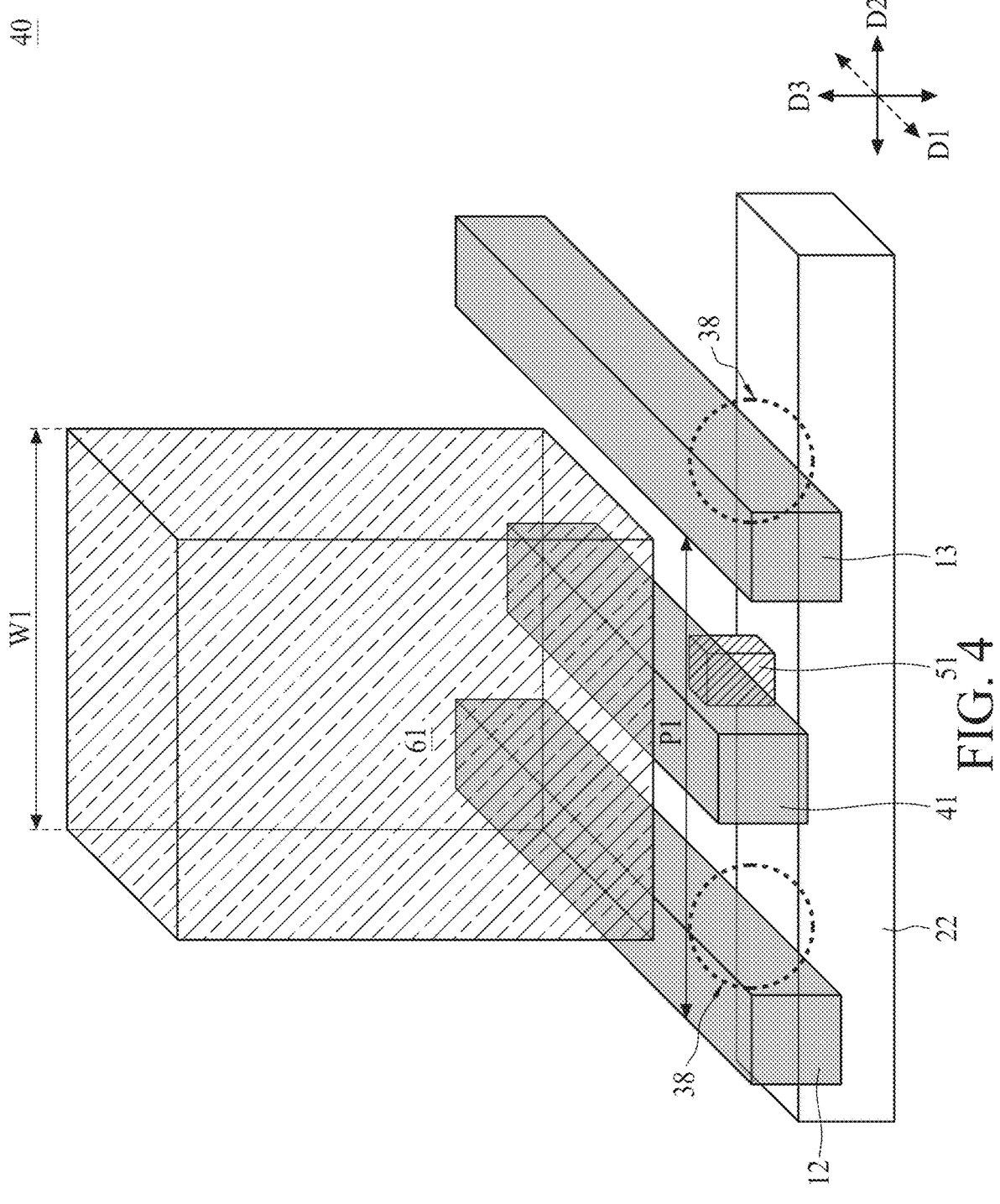
FIG. 4 is a schematic perspective view of the stack structure in FIG. 3, in accordance with some embodiments of the present disclosure.

FIG. 3 is an enlarged view of a stack structure 40 of the power grid structure 70 in FIG. 2, in accordance with some embodiments of the present disclosure. FIG. 4 is a schematic perspective view of the stack structure 40 in FIG. 3, in accordance with some embodiments of the present disclosure. Referring to FIGS. 2 to 4, in some embodiments, the first conductive wire 41 is disposed on, and coupled to, the BM1 VSS rail 22 through a first conductive via 51, the second conductive wire 42 is disposed on, and coupled to, the BM1 VSS rail 22 through a second conductive via 52, the third conductive wire 43 is disposed on, and coupled to, the BM1 VSS rail 30 through a third conductive via 53, the fourth conductive wire 44 is disposed on, and coupled to, the BM1 VSS rail 30 through a fourth conductive via 54, the fifth conductive wire 45 is disposed on, and coupled to, the BM1 VSS rail 26 through a fifth conductive via 55, and the sixth conductive wire 46 is disposed on, and coupled to, the BM1 VSS rail 34 through a sixth conductive via 56. In other words, the first conductive via 51 is disposed between the first conductive wire 41 and the BM1 VSS rail 22, the second conductive via 52 is disposed between the second conductive wire 42 and the BM1 VSS rail 22, the third conductive via 53 is disposed between the third conductive wire 43 and the BM1 VSS rail 30, the fourth conductive via 54 is disposed between the fourth conductive wire 44 and the BM1 VSS rail 30, the fifth conductive via 55 is disposed between the fifth conductive wire 45 and the BM1 VSS rail 26, and the sixth conductive via 56 is disposed between the sixth conductive wire 46 and the BM1 VSS rail 34.

The conductive vias 51 to 56 are at a level of the via layer BVIA0. The conductive vias 51 to 56 extend along the third direction D3. In at least one embodiment, the conductive via 55 is inside a quadrilateral having the conductive vias 51 to

54 at the corners. In some embodiments, the conductive via 55 is disposed at a consistent distance away from each of the conductive vias 51, 52, 53 and 54. That is, the distances from each of the conductive vias 51, 52, 53 and 54 to the conductive via 55 are equal or substantially equal to each other. In some embodiments, the conductive via 55 is centrally or substantially centrally located between the conductive vias 51, 52, 53 and 54. That is, the conductive vias 51 to 54 are arranged at the corners of a square or rectangle, and the conductive via 55 is arranged at the center of the square or rectangle, from the top view. In some embodiments, the conductive vias 53, 54, 55, 56 are at corners of a rhombus. In some embodiments, from the top view, the through vias 61 to 66 are vertically aligned correspondingly with the conductive vias 51 to 56. FIG. 4 shows the through via 61 is vertically aligned with the conductive via 51 as an example. In some embodiments, the described arrangement of the through vias 61-66, conductive vias 51 to 56, and conductive wires 41-46 is repeated at regular intervals along the first direction D1 and second direction D2 throughout the power grid structure 70.

In some embodiments, the semiconductor device 100 includes a plurality of VDD vias which couple two VDD rails in different metal layers and a plurality of VSS vias which couple two VSS rails in different metal layers. The VDD vias and the VSS vias are referred to as power delivery vias. Due to at least one constraint of design rules, a small spacing between adjacent vias is not allowed. A VSS via or a VDD via is not to be disposed too proximal to a neighboring via. In some embodiments, at intersections where the BM0 VDD rails 11, 13, 15, 17, 19 and 21 are vertically aligned correspondingly with the BM1 VDD rails 21, 23, 25, 27, 29, 31 and 33, a VDD via 36 is disposed at each intersection to couple the corresponding VDD rails. Referring to FIGS. 3 and 4, at intersections where one of the BM0 VSS rails 12, 14, 16, 18 and 20 is vertically aligned correspondingly with one of the BM1 VSS rails 22, 24, 26, 28, 30 and 32, a VSS via 37 should be disposed at each intersection to couple the corresponding VSS rails. However, due to the existence of the conductive vias such as 51 to 56, a VDD via 36 or a VSS via 37 cannot be disposed at an intersection between two vertically aligned VSS rails proximal to one of the conductive vias 51 to 56. The conductive vias 51 to 56 together with the conductive wires 41 to 46 are configured to electrically couple the through vias 61 to 66 to their corresponding BM1 VSS rails such as 22, 26, 30 and 34. As a result, there are some positions where a VDD via 36 or a VSS via 37 should be disposed but cannot be disposed due to an existence of a neighboring conductive via in the power grid structure 70. Such positions are referred to as empty via sites. The empty via sites in FIGS. 2 to 4 are given the numeral 38. In some cases, an empty via site potentially induces an IR drop because it lacks a VDD via 36 or a VSS via 37. The IR drop is a phenomenon in which, when a current flows through an electrical element, a voltage corresponding to the current drops. When multiple empty via sites are densely positioned in a power grid structure, the power grid structure potentially suffer from a significant IR drop at the empty via sites. In one or more embodiments of the present disclosure, positions of the empty via sites 38 are sufficiently evenly distributed in the power grid structure 70. Therefore, it is possible to reduce or mitigate the IR drop of the power grid structure 70, in one or more embodiments. Specifically, in the power grid structure 70, the through vias 61-66 are distributed to multiple rows, e.g., to multiple pairs of a BM0 VSS rail and an adjacent BM0 VDD rail, in a staggering arrangement. As a result, a number of through vias (and corresponding empty via sites) along each row is reduced. Therefore, IR drops associated with currents flowing along each row, i.e., along the corresponding pair of a BM0 VSS rail and an adjacent BM0 VDD rail, are reduced and/or mitigated, in one or more embodiments. This is an improvement over other approaches in which FTVs are concentrated along certain rows and cause significant IR drops along those rows.

Still referring to FIG. 4, in some embodiments, each of the through vias 61 to 66 has a width W1 equal or substantially equal to or greater than the first pitch P1. Therefore, although the through vias 61 to 66 are respectively disposed correspondingly on the conductive wires 41 to 46, it is possible that the through vias 61 to 66 contact portions of the corresponding underlying BM0 VSS rails or BM0 VDD rails. Using the first through via 61 as an example, in some embodiments, the first through via 61 at least overlaps and contacts a portion of the BM0 VSS rail 12 or a portion of the BM0 VDD rail 13. The first through via 61 may be electrically coupled to the BM0 VSS rail 12 or the BM0 VDD rail 13, separately. In some other embodiments, the first through via 61 does not directly contact the BM0 VSS rail 12 and the BM0 VDD rail 13. The first through via 61 may be electrically coupled to the BM0 VSS rail 12 through a conductive member (not shown) over the BM0 VSS rail 12.

Figure 5:
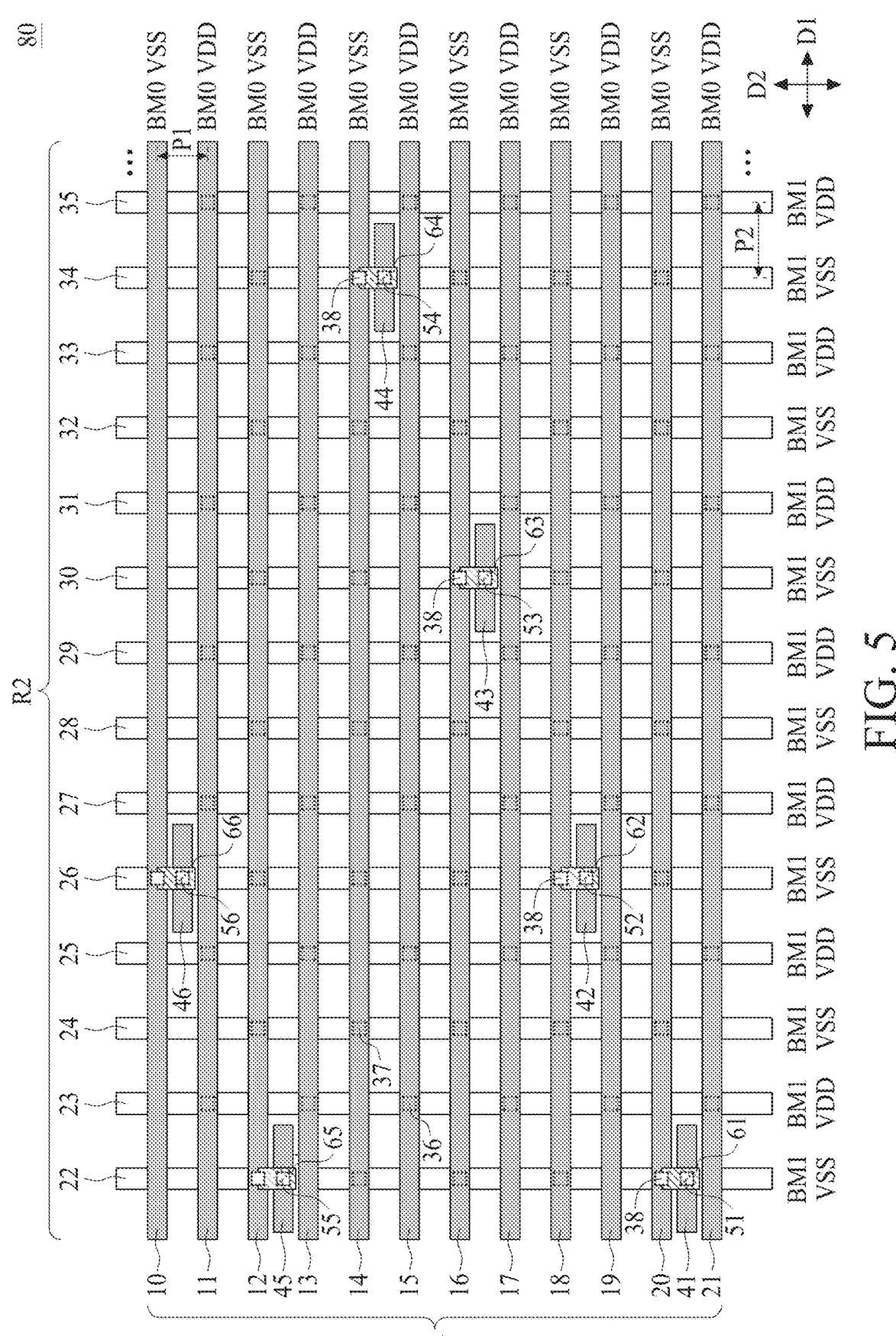
FIGS. 5 and 6 are schematic top views of various power grid structures of the semiconductor device in FIG. 1, in accordance with some other embodiments of the present disclosure.
Figure 6:
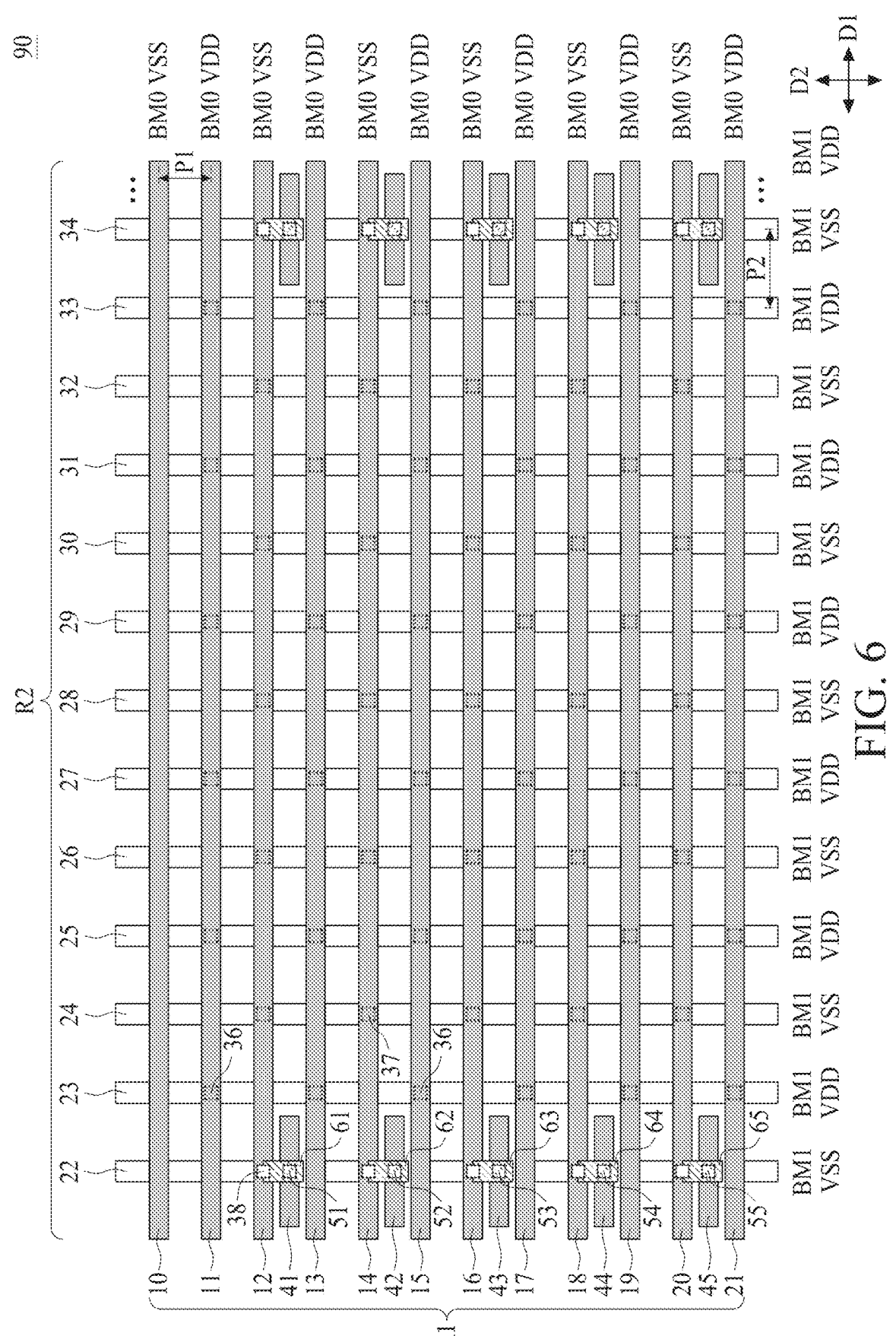

FIGS. 5 and 6 are schematic top views of power grid structures 80 and 90 of the semiconductor device 100 in FIG. 1, in accordance with some other embodiments of the present disclosure. The power grid structures 80 and 90 are similar to the power grid structure 70 in FIG. 2. Elements of the power grid structures 80 and 90 that are same as those of the power grid structure 70 are referred to by same numerals, and their related description are omitted. Designs of the power grid structures 80 and 90 are generated using an EDA operation, in one or more embodiments.

Referring to FIG. 5, in some embodiments, the conductive vias 51 to 54 and the like are diagonally arranged in the power grid structure 80. That is, the conductive wires 41 to 44 are arranged along a straight line diagonal to the first direction D1 and the second direction D2. In such embodiments, the conductive wires 41 to 44 and the like, as well as the through vias 61 to 64 and the like, are also diagonally arranged. The first through via 61 is immediately neighboring to the fifth through via 65. That is, there is no other through via between the first through via 61 and the fifth through via 65 along the power rail 22. Likewise, the second through via 62 is immediately neighboring to the sixth through via 66. The first through via 61 is immediately neighboring to the second through via 62. That is, along the straight diagonal line connecting the through vias 61 to 64, there is no other through via between the first through via 61 and the second through via 62. Likewise, the second through via 62 is immediately neighboring to the third through via 63, the third through via 63 is immediately neighboring to the fourth through via 64, the fifth through via 65 is immediately neighboring to the sixth through via 66. The described arrangement is sometimes referred to as a ladder arrangement. In some embodiments, the described ladder arrangement is repeated at regular intervals along the first direction D1 and second direction D2 throughout the power grid structure 80. For example, as the power grid structure 80 is further expanded to the right in FIG. 5, two additional through vias similar to the fifth through via 65 and the sixth through via 66 would be arranged along the same straight diagonal line connecting the through vias 61 to 64. In at least one embodiment, one or more advantages described herein with respect to the power grid structure 70 are achievable by the power grid structure 80.

Referring to FIG. 6, in some embodiments, in the power grid structures 90, the conductive vias 51 to 55 and the like are arranged along the second direction D2 and separated from each other by a first interval. In the example configuration in FIG. 6, the first interval is a distance equal to two times the first pitch P1. Other values for the first interval are within the scopes of various embodiments. That is, the conductive vias 51 to 55 form a first column parallel to the second direction D2. A second column formed of other conductive vias is separated from the first column by a second interval which is a distance equal to 10 to 30 times the second pitch P2. FIG. 6 shows an example in which the first column extends along the BM1 VSS rail 22 and the second column extends along the BM1 VSS rail 34. In such embodiments, although an IR drop potentially occurs at the BM1 VSS rails 22 and 34, the BM1 rails 23 to 33 do not suffer from IR drops due to through vias and associated empty via sites. The through vias over the BM1 VSS rails 22 and 34 are configured, in one or more embodiments, to the transmission of signals, power and/or grounding between electrical elements at the opposite first and second sides of the substrate 101 without being influenced by a neighboring empty via site. In some embodiments, the described arrangement, sometimes referred to as a column arrangement, is repeated at regular intervals along the first direction D1 and second direction D2 throughout the power grid structure 90. In at least one embodiment, one or more advantages described herein with respect to the power grid structure 70 are achievable by the power grid structure 90.

Figure 7:
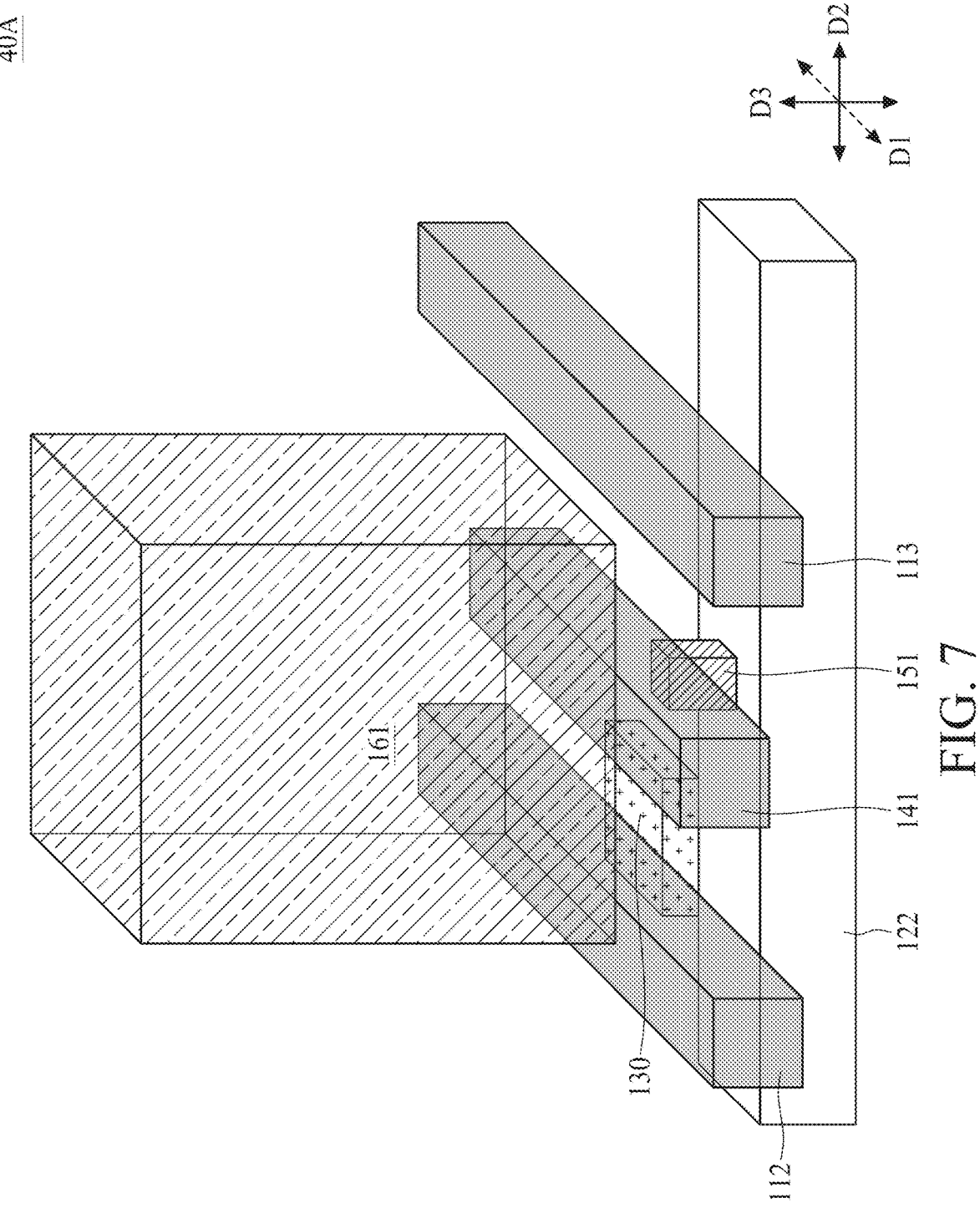
FIGS. 7, 9 and 11 are schematic perspective views of various stack structures of other power grid structures, in accordance with some other embodiments of the present disclosure.
Figure 8:
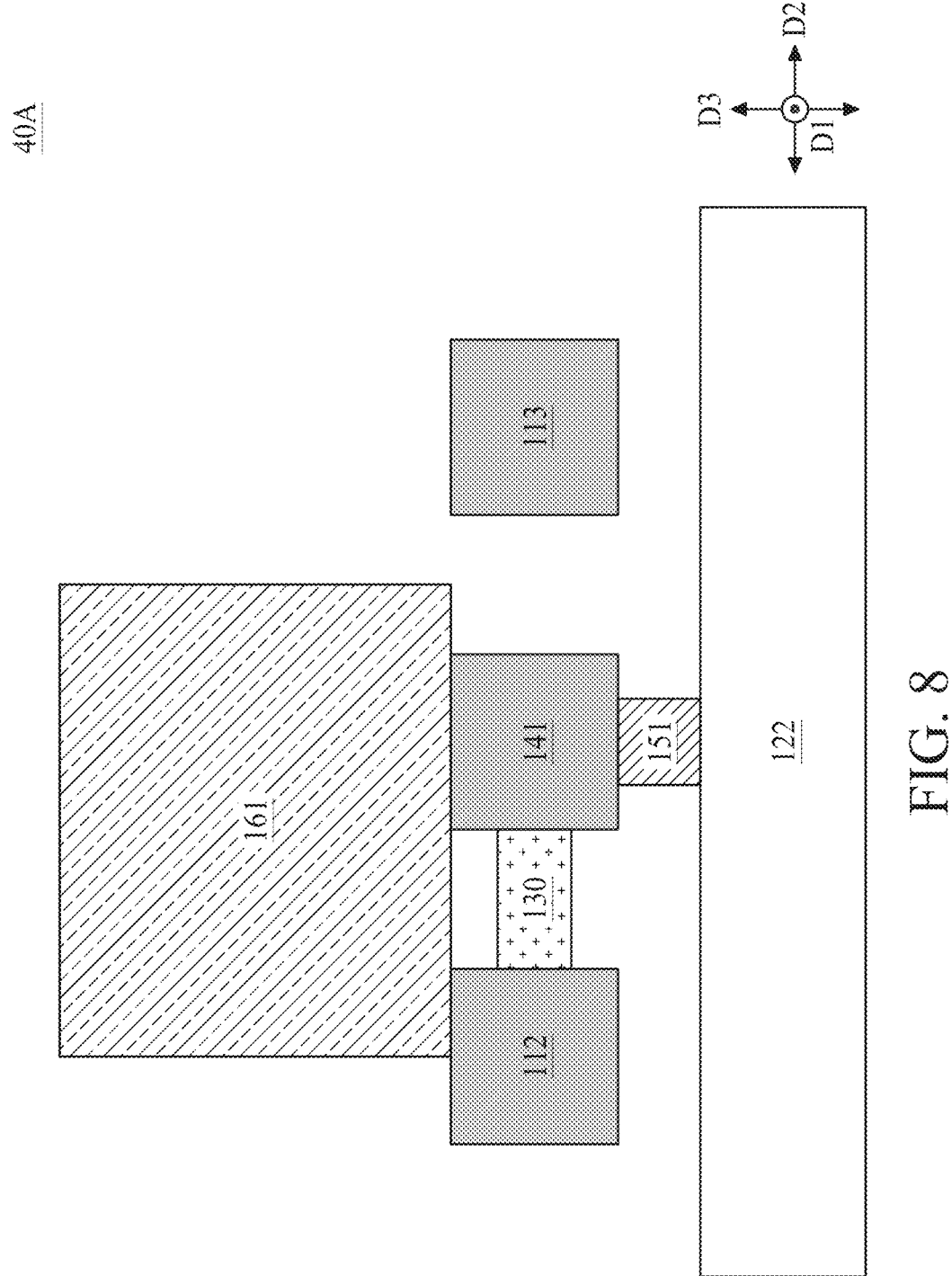
FIGS. 8, 10 and 12 are correspondingly schematic cross-sectional views of the stack structures in FIGS. 7, 9 and 11, in accordance with some embodiments of the present disclosure.
Figure 9:
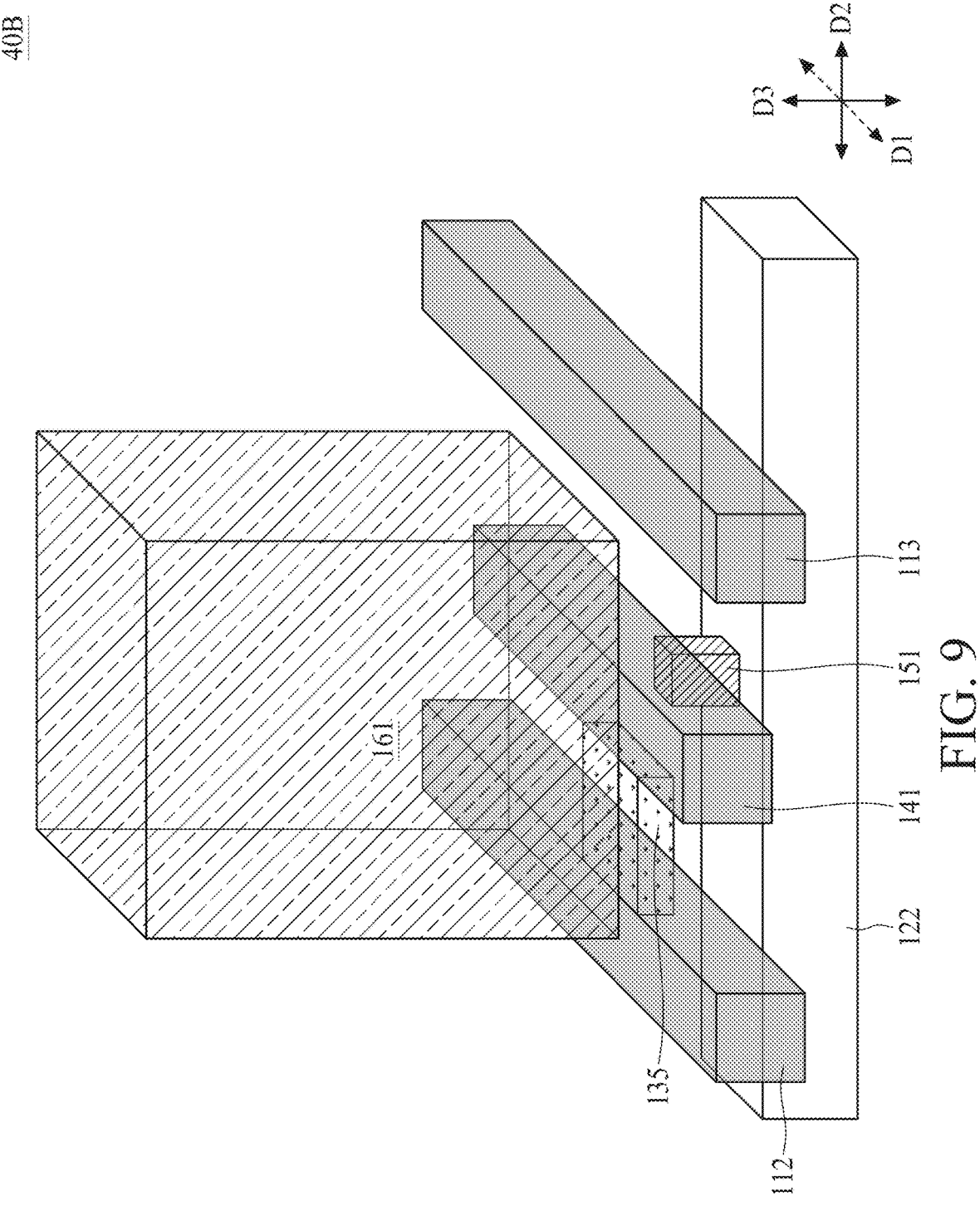
Figure 10:
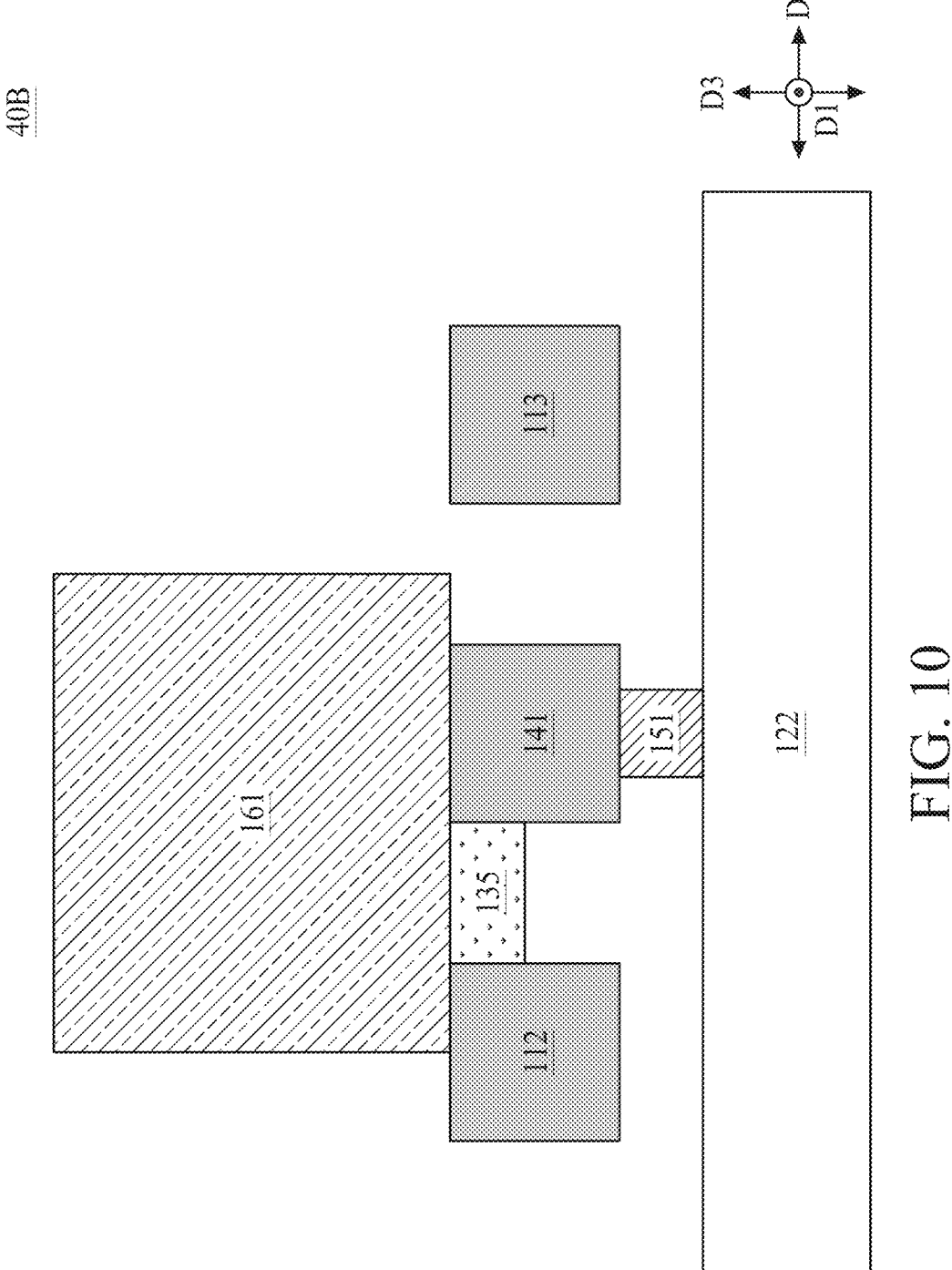
Figure 11:
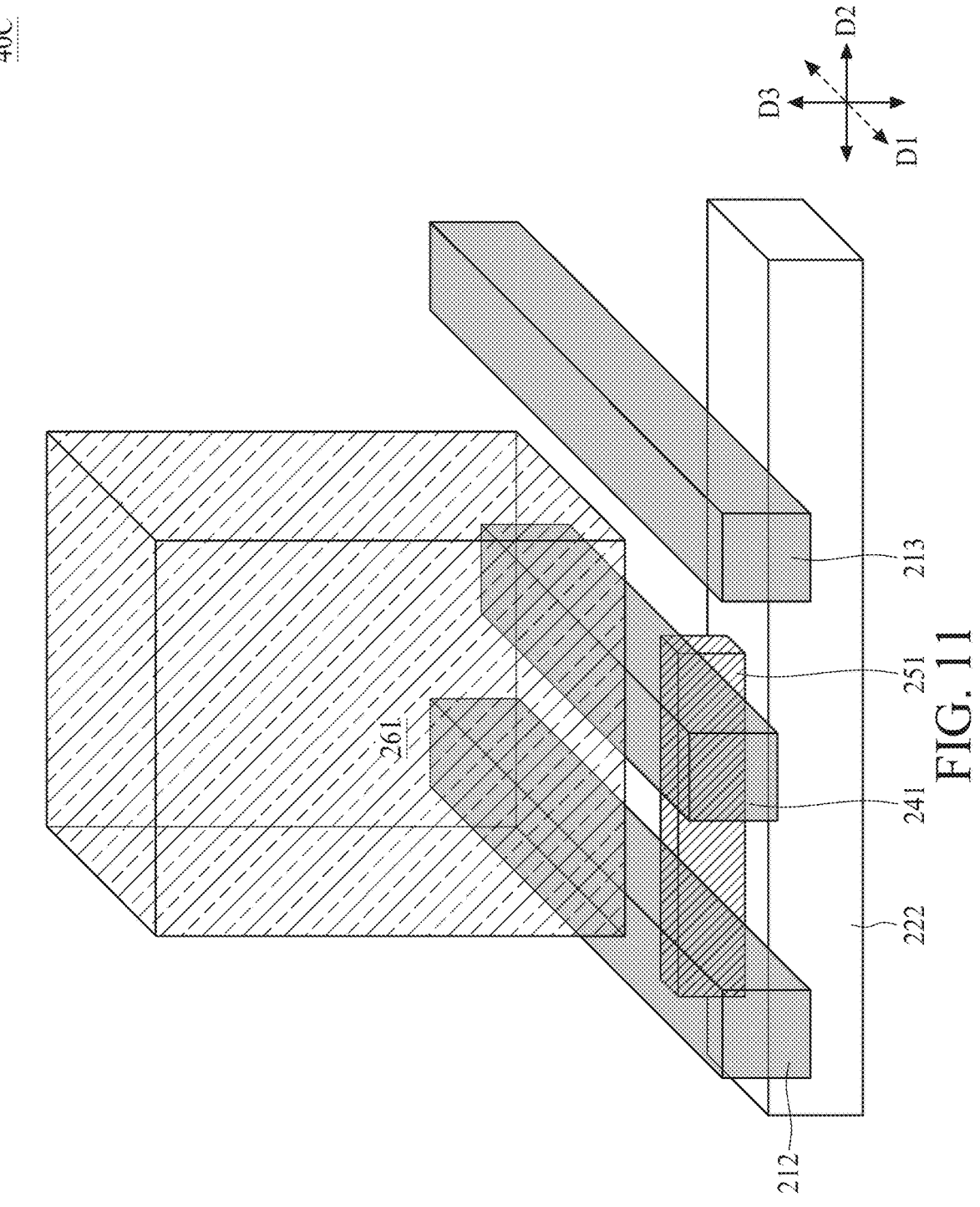
Figure 12:
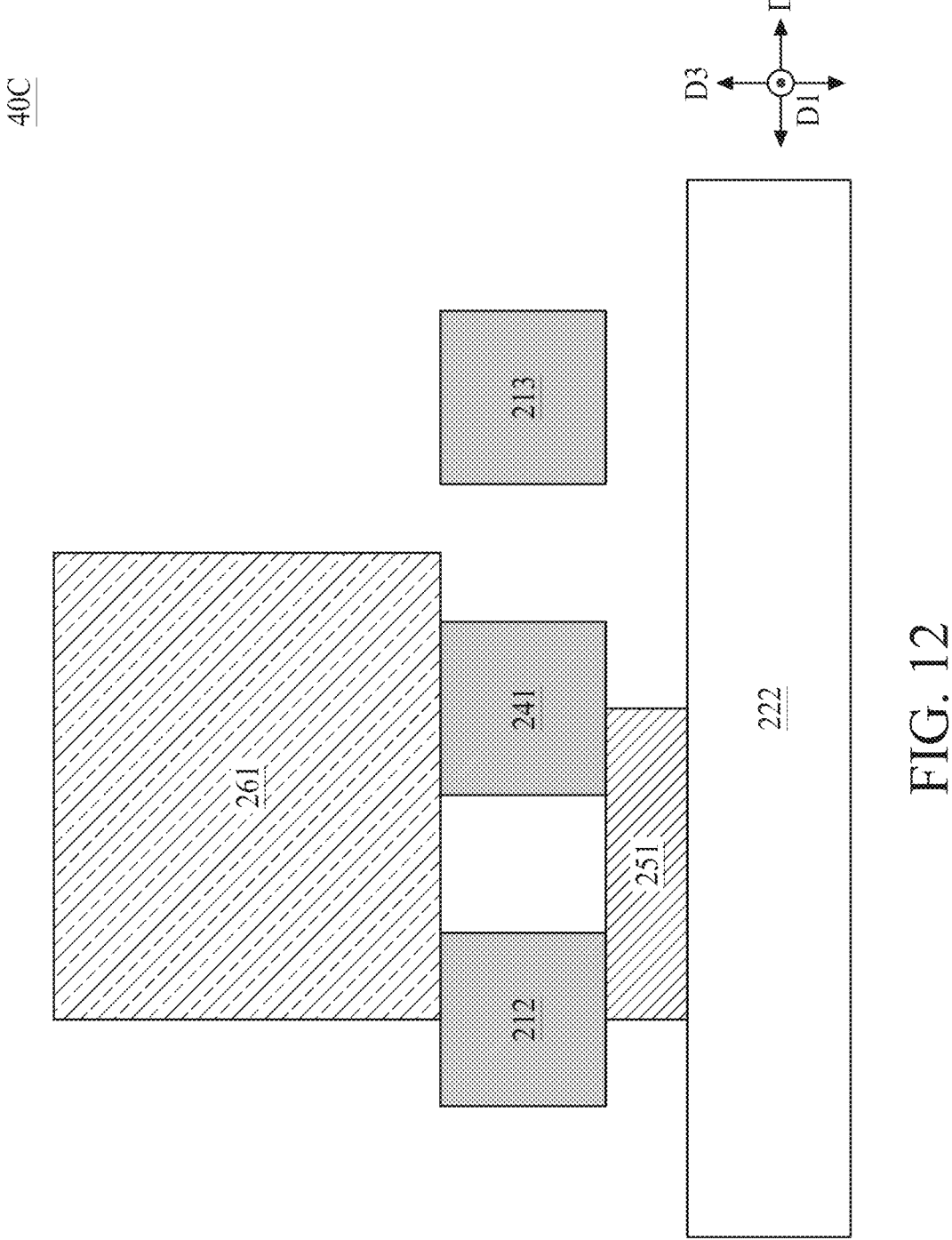

FIGS. 7, 9 and 11 are correspondingly schematic perspective views of stack structures 40A, 40B and 40C of one or more power grid structures, in accordance with some other embodiments of the present disclosure. FIGS. 8, 10 and 12 are correspondingly schematic cross-sectional views of the stack structures 40A, 40B and 40C, in accordance with some embodiments of the present disclosure. The stack structures 40A, 40B and 40C are similar to, and/or replace, the stack structure 40 of the power grid structures 70, 80, 90 in FIGS. 2 to 6. Elements of the stack structures 40A, 40B that are same as those of the stack structure 40 are referred to by the numerals of the stack structure 40 increased by one hundred. Elements of the stack structure 40C that are same as those of the stack structure 40 are referred to by the numerals of the stack structure 40 increased by two hundred.

Referring to FIGS. 7 and 8, the stack structure 40A includes a BM0 VSS rail 112, a conductive wire 141 and a BM0 VDD rail 113 disposed over a BM1 VSS rail 122. The BM0 VSS rail 112, the conductive wire 141 and the BM0 VDD rail 113 extend along the first direction D1 while the BM1 VSS rail 122 extends along the second direction D2. The conductive wire 141 is disposed between the BM0 VSS rail 112 and the BM0 VDD rail 113. The conductive wire 141 is connected to the BM1 VSS rail 122 through a conductive via 151. A through via 161 is vertically aligned with an intersection of the conductive wire 141 and the BM1 VSS rail 122 when viewed from the third direction D3. The through via 161 is disposed on, and coupled to, the conductive wire 141 over such intersection. In at least one embodiment, the through via 161 contacts a portion of the BM0 VSS rail 112. The stack structure 40A includes a connecting member 130 contacting and connecting the BM0 VSS rail 112 and the conductive wire 141. The connecting member 130 is configured as a bridge between the BM0 VSS rail 112 and the conductive wire 141, and is physically spaced from the through via 161 and the BM1 VSS rail 122 along the thickness direction D3. The connecting member 130 allows a direct electrical connection between the BM0 VSS rail 112 and the conductive wire 141. In some other embodiments, where the through via 161, the conductive wire 141, and the conductive via 151 are over and coupled to a BM1 VDD rail, the connecting member 130 is disposed between and coupling the BM0 VDD rail 113 and the conductive wire 141. In some embodiments, the through via 161 at least partially overlaps the conductive wire 141 and the connecting member 130. In some embodiments, the through via 161 at least overlaps and contacts a portion of the BM0 VSS rail 112 or a portion of the BM0 VDD rail 113. The through via 161 may be electrically coupled to the BM0 VSS rail 112 or the BM0 VDD rail 113, separately. In some other embodiments, the through via 161 does not directly contact the BM0 VSS rail 112 and the BM0 VDD rail 113. The through via 161 may be electrically coupled to the BM0 VSS rail 112 through a conductive member (not shown) over the BM0 VSS rail 112. In some embodiments, the connecting member 130 at least partially overlaps the BM1 VSS rail 122 along the third direction D3. As described herein, a VSS via 37 is not placeable at an intersection of the BM1 VSS rail 122 and the BM0 VSS rail 112, due to an empty via site 38 described with respect to FIGS. 2-4. However, even without a VSS via 37, the BM1 VSS rail 122 and the BM0 VSS rail 112 are still coupled to each other near their intersection, by the conductive via 151, the conductive wire 141, and the connecting member 130. Thus, in one or more embodiments, the connecting member 130 effectively replaces a VSS via 37 at the intersection of the BM1 VSS rail 122 and the BM0 VSS rail 112. As a result, IR drops are avoidable along the BM1 VSS rail 122 and the BM0 VSS rail 112, in one or more embodiments. In some embodiments, connecting members similar to the connecting member 130 are provided to other through vias similar to the through via 161. In such embodiments, it is possible to distribute the through vias in the power grid structure in any arrangement, without a risk of large IR drops due to through vias and associated empty via sites.

Referring to FIGS. 9 and 10, the stack structure 40B is similar to the stack structure 40A in FIGS. 7 and 8, except that, instead of the connecting member 130, a connecting member 135 of the stack structure 40B simultaneously contacts the BM0 VSS rail 112, the conductive wire 141 and the through via 161. The connecting member 135 is physically spaced from the BM1 VSS rail 122 along the thickness direction D3. The BM0 VSS rail 112, the conductive wire 141 and the through via 161 are electrically coupled to each other through the connecting member 135. In some embodiments, the connecting member 135 at least partially overlaps the BM1 VSS rail 122 along the third direction D3. In at least one embodiment, one or more advantages described herein with respect to the stack structure 40A are achievable by the stack structure 40B and/or a power grid structure comprising the stack structure 40B.

Referring to FIGS. 11 and 12, the stack structure 40C includes a BM0 VSS rail 212, a conductive wire 241 and a BM0 VDD rail 213 disposed over a BM1 VSS rail 222. The BM0 VSS rail 212, the conductive wire 241 and the BM0 VDD rail 213 extend along the first direction D1 while the BM1 VSS rail 222 extends along the second direction D2. The conductive wire 241 is disposed between the BM0 VSS rail 212 and the BM0 VDD rail 213. A through via 261 is vertically aligned with an intersection of the conductive wire 241 and the BM1 VSS rail 222 when viewed from the third direction D3. The through via 261 is disposed on, and coupled to, the conductive wire 241 over such intersection. In at least one embodiment, the through via 261 contacts a portion of the BM0 VSS rail 212. The BM0 VSS rail 212 and the conductive wire 241 are connected to the BM1 VSS rail 222 through a bridging via 251, which replaces the conductive via 51 or 151. In some other embodiments, where the through via 261 and the conductive wire 241 are over and coupled to a BM1 VDD rail, the BM0 VDD rail 213 and the conductive wire 241 are connected to the BM1 VDD rail through a bridging via similar to the bridging via 251. The bridging via 251 extends along the second direction D2. The bridging via 251 electrically couples the BM0 VSS rail 212 to the conductive wire 241. In some embodiments, an entirety of the bridging via 251 completely overlaps the BM1 VSS rail 222 when viewed along the third direction D3. In some other embodiments, the bridging via 251 partially overlaps the BM1 VSS rail 222 when viewed along the third direction D3. The bridging via 251 comprises an element similar to the conductive via 51 or 151 and extends along the second direction D2. In at least one embodiment, one or more advantages described herein with respect to the stack structure 40A are achievable by the stack structure 40C and/or a power grid structure comprising the stack structure 40C. In some embodiments, the connecting member 130 in FIGS. 7, 8, the connecting member 135 in FIGS. 9, 10 and/or the bridging via 251 in FIGS. 11, 12 are collaboratively or separately included in at least one of the power grid structures 70, 80 or 90. In some embodiments, the connecting member 130 in FIGS. 7, 8, the connecting member 135 in FIGS. 9, 10 and/or the bridging via 251 in FIGS. 11, 12 are collaboratively or separately included in a power grid structure with any arrangement of through vias.

Some embodiments of the present disclosure also provide a method of manufacturing a semiconductor device. The semiconductor device may comprise a stack structure. FIG. 13 is a flow diagram showing a method 200 of fabricating one or more of the stack structures 40A-40C in FIGS. 8-12. FIGS. 14 to 19 are schematic cross-sectional views illustrating sequential operations of the method 200 in FIG. 13 performed in accordance with some embodiments to fabricate the stack structure 40C in FIG. 12. The method 200 includes a number of operations 203, 205, 207, 209 and 211, and the description and illustration are not deemed as a limitation to the sequence of the operations. Further, for illustrative purposes, FIGS. 14-19 show various structures in the same orientations as corresponding structures in one or more of FIGS. 8-12. However, in one or more embodiments, the operations of the method 200 are performed when the structures in FIGS. 14-19 are in an upside-down orientation. For example, although FIG. 16 illustrates that a second surface S12 faces downward and a first rail 212 and a second rail 213 are under a through via 261, in the upside-down orientation in accordance with some embodiments, the second surface S12 faces upward and the first rail 212 and second rail 213 are formed over the through via 261.

Figure 14:
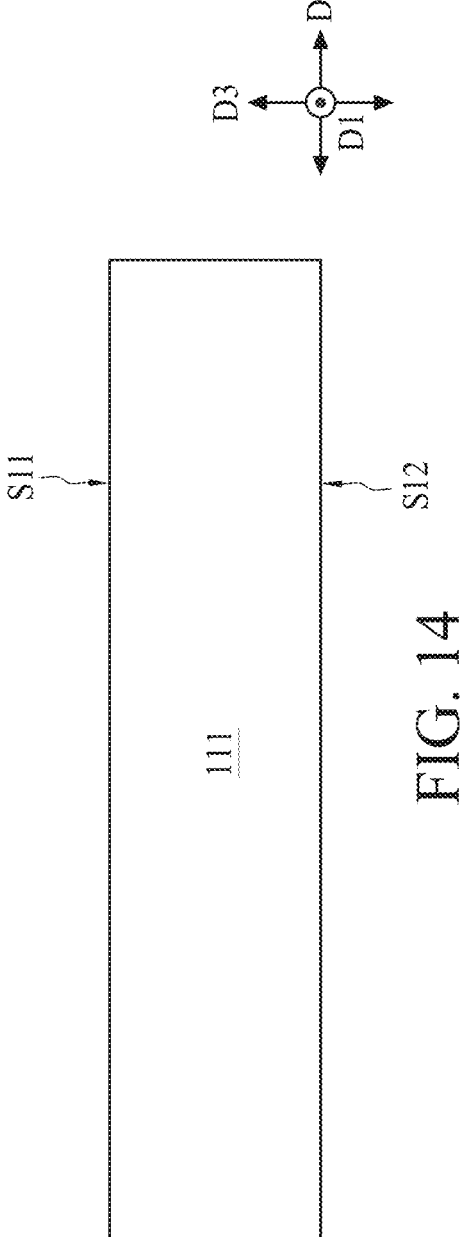
FIGS. 14 to 19 are schematic cross-sectional views illustrating sequential operations of the method in FIG. 13, in accordance with some embodiments of the present disclosure.

In operation 203 of FIG. 13, a through via is formed to penetrate a substrate including a first side and a second side opposite to the first side. For example, a substrate 111 is provided, as shown in FIG. 14. The substrate 111 may be similar to the substrate 101 shown in FIG. 1. Example materials of the substrate 111 include, but are not limited to, silicon (Si), other group III, group IV, and/or group V elements, such as germanium (Ge), gallium (Ga), arsenic (As), or combinations thereof. The substrate 111 may a bulk substrate or silicon-on-insulator (SOI) substrate. The substrate 111 has a first surface S11 on one side of the substrate 111 and a second surface S12 on the other side of the substrate 111. The second surface S12 is opposite to the first surface S11.

Figure 15:
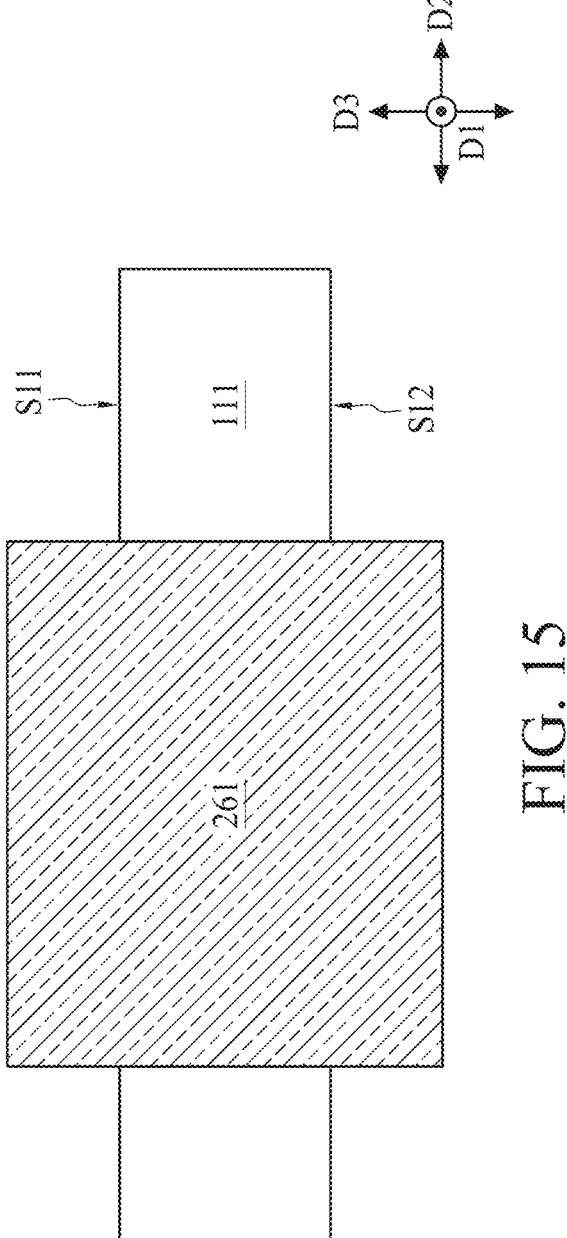
Figure 16:
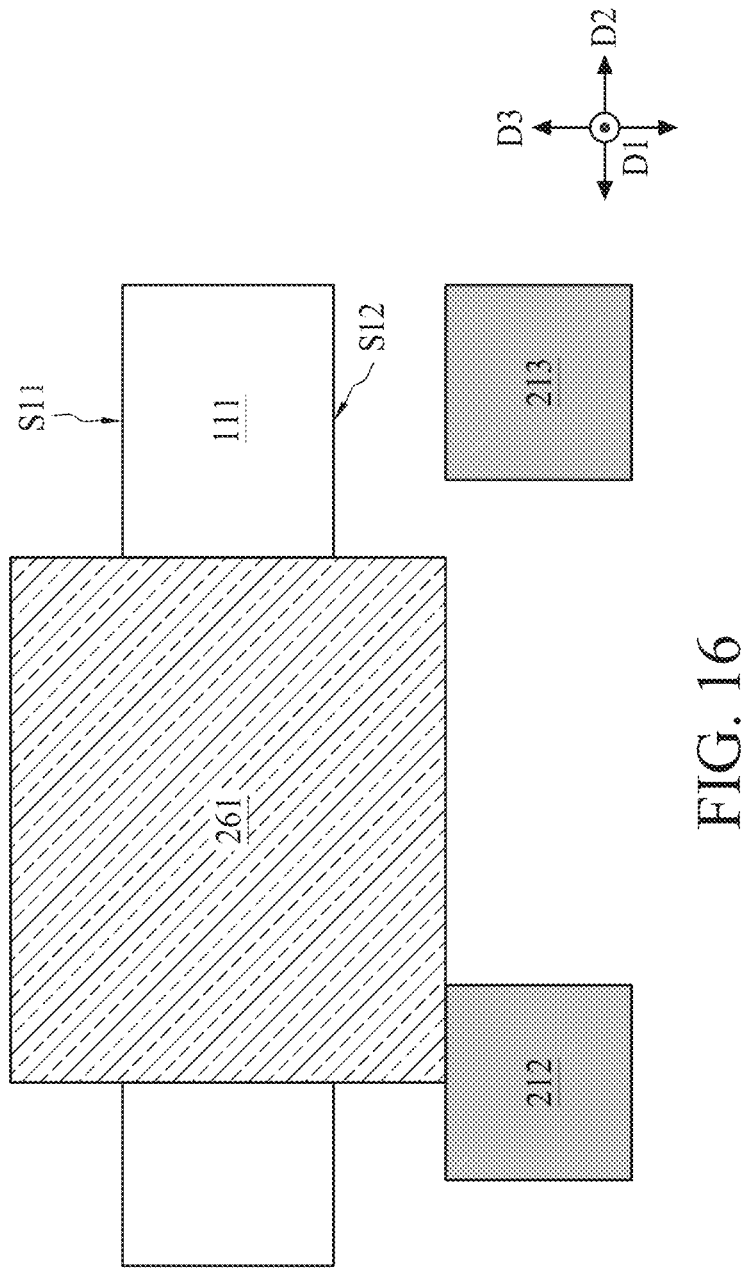

A through via 261 is formed penetrating the substrate 111, as shown in FIG. 15. The through via 261 extends from the second surface S12 to the first surface S11 and along a third direction D3 (which is sometimes called the thickness direction D3 of the substrate 111). Although not specifically illustrated, a dielectric layer (not shown) may be formed on the second surface S12 of the substrate 111 for subsequent operations such as photolithographic, etching, deposition or planarization operations. The dielectric layer in FIGS. 15 to 19 are not shown for simplicity.

In operations 205-211 of FIG. 13, various deposition and patterning operations are performed at the second side, which in one or more embodiments faces upward in the described upside-down orientation, to form various features, for example, as described herein with respect to FIGS. 16-19.

In operation 205 of FIG. 13, a first rail and a second rail extending along a first direction are formed. For example, a first rail 212 and a second rail 213 are formed at the second side of the substrate 111, as shown in FIG. 16. The rails 212 and 213 may refer to long metal lines disposed parallel to each other and surrounded by the dielectric layer. The rails 212 and 213 may extend along a first direction D1. To form the rails 212 and 213, multiple trenches may be formed in the dielectric layer over the second surface S12 of the substrate 111. A conductive material such as W, Cu, Co, Al, Ni, Ta, Ti, Mo, Pd, Pt, Ru, Ir, Ag, Au, TiN, TaN, the like, or a combination thereof may be deposited into the trenches to form the rails 212 and 213. The rails 212, 213 and other rails in the same layer as the rails 212, 213 are configured to transmit power and/or signals at the second surface S12 of the substrate 111.

Figure 17:
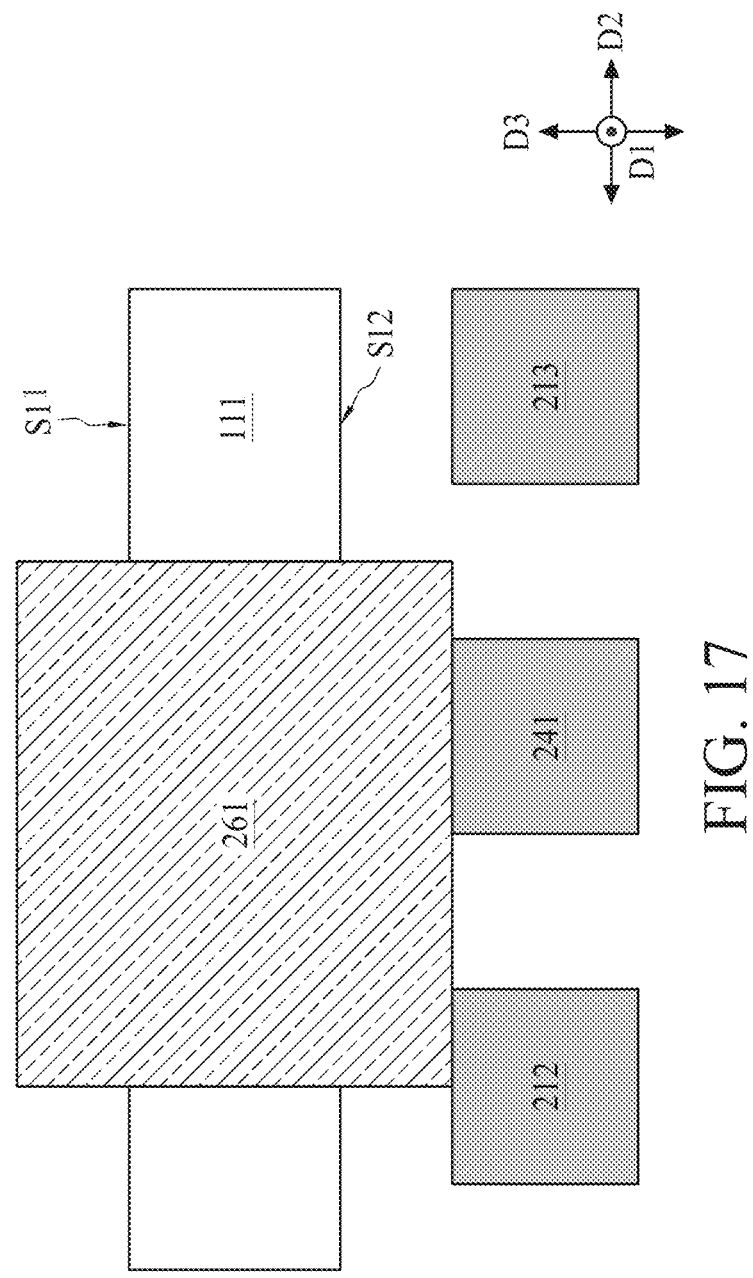

In operation 207 of FIG. 13, a conductive wire 241 is formed over (in the upside-down orientation described herein) the through via 261 and between the first rail 212 and the second rail 213, as shown in FIG. 17. The conductive wire 241 may be formed using a method similar to that used for forming the first rail 212 and the second rail 213. In some embodiments, the conductive wire 241 is shorter than the first rail 212 or the second rail 213 in the first direction. The conductive wire 241 may be referred to herein as a short rail 241. The conductive wire 241 may be electrically coupled to the through via 261. In some embodiments, the conductive wire 241 is formed simultaneously with the first rail 212 and the second rail 213.

Figure 18:
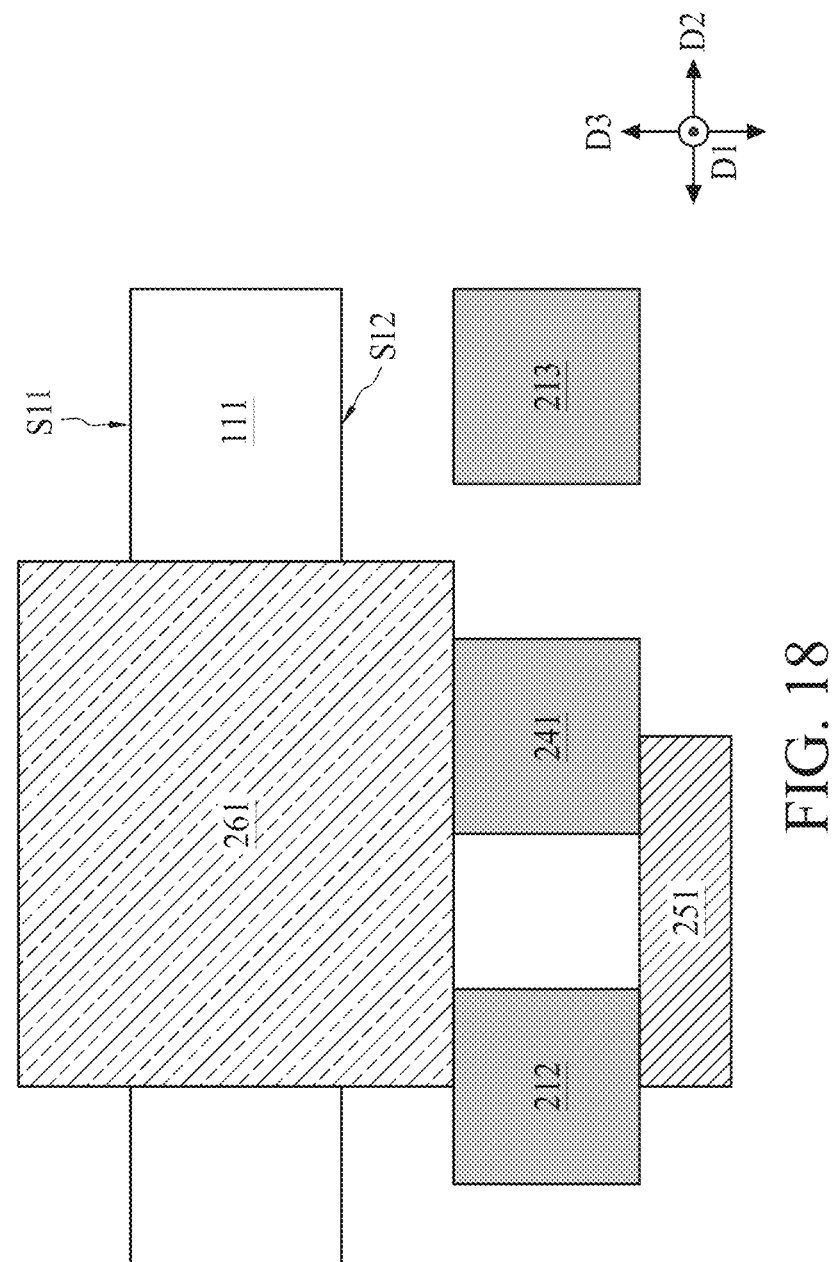

In operation 209 of FIG. 13, a conductor electrically coupling the first rail to the conductive wire is formed. For example, the conductor is a bridging via 251 which is formed over (in the upside-down orientation described herein) and electrically couples the first rail 212 and the conductive wire 241, as shown in FIG. 18. The bridging via 251 may be formed using a method similar to that used for forming the first rail 212 and the second rail 213. However, the bridging via 251 extends along a second direction D2 perpendicular to the first direction D1. The bridging via 251 may electrically couple the first rail 212 to the conductive wire 241.

For another example (not shown), the conductor is a connecting member corresponding to the connecting member 130 or the connecting member 135. A conductive via (not shown) corresponding to the conductive via 151 is formed over (in the upside-down orientation described herein) the conductive wire 241 for electrically coupling the conductive wire 241 to a subsequently formed third rail, as described herein.

Figure 19:
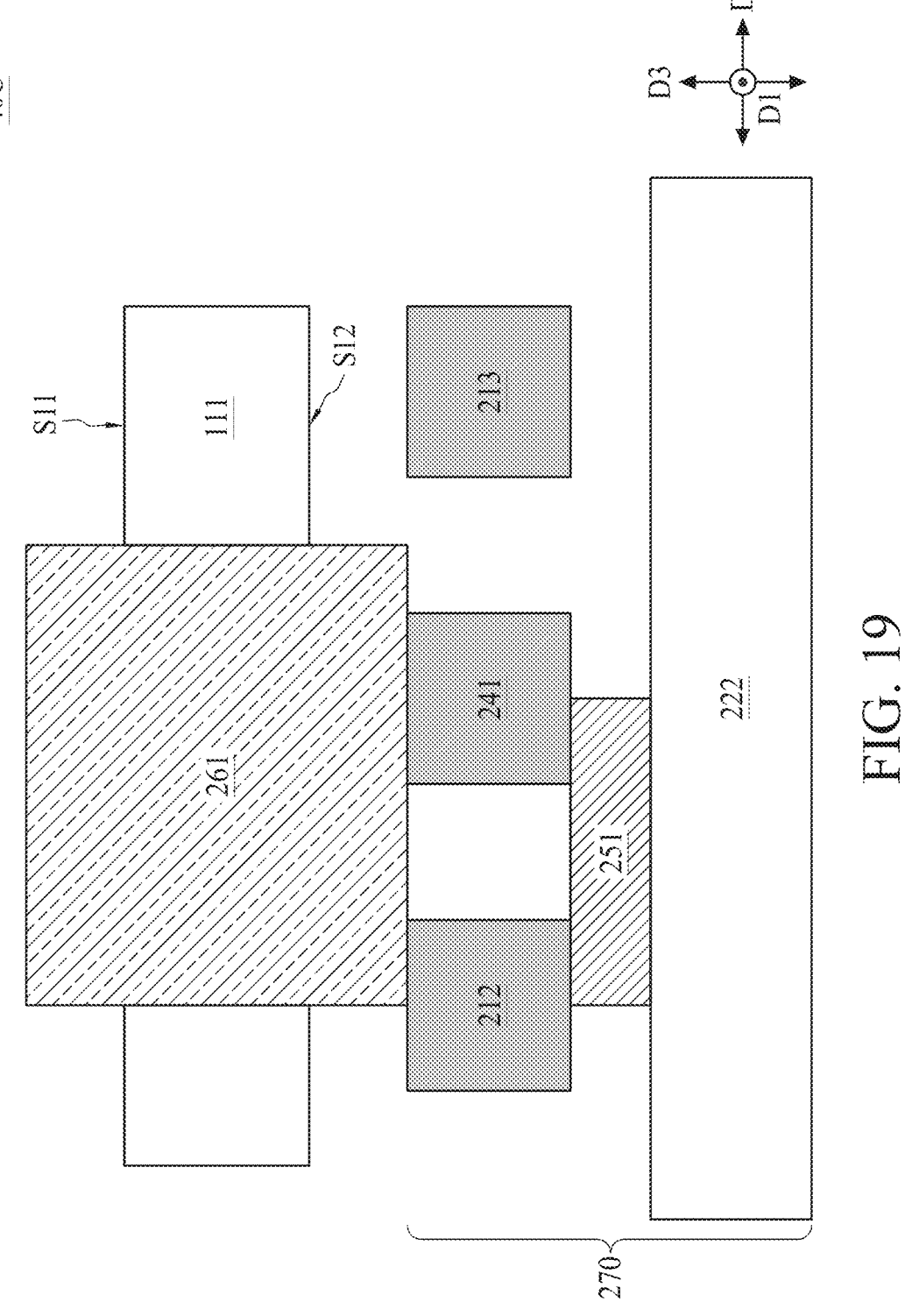

In operation 211 of FIG. 13, a third rail is formed over the first rail, the second rail and the conductive wire, the third rail extending along a second direction perpendicular to the first direction. For example, a third rail 222 is formed over (in the upside-down orientation described herein) the bridging via 251, as shown in FIG. 19. The third rail 222 may be formed using a method similar to that used for forming the first rail 212 and the second rail 213. In some embodiments, the third rail 222 extends along the second direction D2. In some embodiments, an entirety of the bridging via 251 completely overlaps the third rail 222 when viewed along the third direction D3. In some other embodiments, the bridging via 251 partially overlaps the third rail 222 when viewed along the third direction D3. In some embodiments, at least a portion of the through via 261 is disposed within an intersection of the conductive wire 241 and the third rail 222 when viewed along the third direction D3. The third rail 222 may be electrically coupled to the first rail 212 through the bridging via 251. The third rail 222 may be electrically coupled to the through via 261 by the bridging via 251 and the first rail 212 or the conductive wire 241. The third rail 222 and other rails in the same layer as the third rail 222 are configured to transmit power and/or signals at the second surface S12 of the substrate 111. The rails 212, 213, 241 and 222 and the bridging via 251 may form the stack structure 40C. In some embodiments, multiple stack structures 40C may form a power grid structure 270 similar to the power grid structure 70 shown in FIG. 2, the power grid structure 80 shown in FIG. 5 or the power grid structure 90 shown in FIG. 6.

Some embodiments of the present disclosure provide a semiconductor device including a power grid structure comprising a plurality of through vias (FTVs). The power grid structure further includes a plurality of various vias. However, due to one or more of the design rules, a small spacing between adjacent vias is forbidden. Some spaces or positions in the power grid structure originally intended for disposing VDD or VSS vias are to be reserved for disposing conductive vias that are electrically coupled to the FTVs. Such positions where VDD and VSS vias are not placeable potentially induce an IR drop. Therefore, the placement and/or connection of FTVs are design consideration for the power grid structures. In one or more embodiments of the present disclosure, positions of FTVs are sufficiently evenly distributed in the power grid structure. The FTVs are arranged in a staggering, ladder or column arrangement, as described herein, so as to mitigate a concentration of IR drop regions. Therefore, it is possible to reduce IR drops of the power grid structure, in one or more embodiments. The present disclosure also provides, in one or more embodiments, various structures including a connecting member or a bridging via. The connecting member or bridging via electrically couples a first VDD (or VSS) power rail without a VDD (or VSS) via being disposed thereon to a corresponding second VDD (or VSS) power rail. The first power rail and the second power rail are at a same level (e.g., a same metal layer) or different levels (e.g., different metal layers). With the use of the connecting member or bridging via, it is possible to significantly reduce the IR drop phenomenon in the power grid structure, in one or more embodiments.

In some embodiments, a semiconductor devices includes: a substrate including a first side and a second side opposite to the first side, a power grid structure disposed over the second side, and a through via penetrating the substrate. The power grid structure includes: a first rail extending along a first direction, a second rail disposed parallel to the first rail, a conductive wire, a third rail, a conductive via, and a connecting member. The conductive wire is disposed between the first rail and the second rail, and extends along the first direction. The third rail is disposed below the first rail, the second rail and the conductive wire, and extends along a second direction perpendicular to the first direction. The conductive via is disposed between and electrically couples the conductive wire to the third rail. The connecting member is disposed between and electrically couples the first rail to the conductive wire. The through via extends through the substrate and along a third direction perpendicular to the first direction and the second direction. The through via is disposed on and coupled to the conductive wire.

In some embodiments, a semiconductor devices includes: a substrate including a first side and a second side opposite to the first side, a power grid structure disposed over the second side, and first through fifth through vias penetrating the substrate. The power grid structure includes: a first rail, a second rail, a third rail and a fourth rail, each of which extends along a first direction, and a fifth rail and a sixth rail disposed under the first rail, the second rail, the third rail and the fourth rail, and extending along a second direction perpendicular to the first direction. The first through fifth through vias extend through the substrate and along a third direction perpendicular to the first direction and the second direction. The first through via is over the fifth rail and between the first rail and the second rail. The second through via is over the fifth rail and between the third rail and the fourth rail. The second through via is immediately neighboring to the first through via along the fifth rail. The third through via is over the sixth rail and between the first rail and the second rail. The third through via is immediately neighboring to the first through via along the first rail and the second rail. The fourth through via is over the sixth rail and between the third rail and the fourth rail. The fourth through via is immediately neighboring to the second through via along the third rail and the fourth rail, and immediately neighboring to the third through via along the sixth rail. The fifth through via is inside a quadrilateral having, at corners thereof, the first through fourth through vias.

In some embodiments, a method of manufacturing a semiconductor device includes: forming a through via penetrating a substrate including a first side and a second side opposite to the first side, and performing, at the second side of the substrate, deposition and patterning operations. The deposition and patterning operations form a first rail and a second rail extending along a first direction, a conductive wire over the through via, between the first rail and the second rail and extending along the first direction, and a conductor electrically coupling the first rail to the conductive wire.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

The invention claimed is:

1. A semiconductor device, comprising:
a substrate, including a first side and a second side opposite to the first side;
a power grid structure, disposed over the second side, wherein the power grid structure includes:
a first rail, extending along a first direction;
a second rail, disposed parallel to the first rail;
a conductive wire, disposed between the first rail and the second rail and extending along the first direction;
a third rail, disposed below the first rail, the second rail and the conductive wire, and extending along a second direction perpendicular to the first direction;
a conductive via, disposed between and electrically coupling the conductive wire to the third rail; and
a connecting member, disposed between and electrically coupling the first rail to the conductive wire; and
a through via, extending through the substrate and along a third direction perpendicular to the first direction and the second direction, wherein the through via is disposed on and coupled to the conductive wire,
wherein, along the third direction, the first rail is between the through via and the third rail.

2. The semiconductor device of claim 1, wherein the through via overlaps the conductive via when viewed along the third direction.

3. The semiconductor device of claim 1, wherein the through via at least partially overlaps the first rail, the conductive wire and the conductive via when viewed along the third direction.

4. The semiconductor device of claim 1, wherein the through via at least partially overlaps the connecting member when viewed along the third direction.

5. The semiconductor device of claim 1, wherein the through via at least partially overlaps the first rail, the conductive wire, the connecting member, and the conductive via when viewed along the third direction.

6. The semiconductor device of claim 4, wherein the connecting member contacts the through via.

7. The semiconductor device of claim 4, wherein the connecting member is physically spaced from the through via in the third direction.

8. A semiconductor device, comprising:
a substrate, including a first side and a second side opposite to the first side;
a power grid structure, disposed over the second side, wherein the power grid structure includes:
a first rail, a second rail, a third rail and a fourth rail, each of which extends along a first direction; and a fifth rail and a sixth rail, disposed under the first rail, the second rail, the third rail and the fourth rail, and extending along a second direction perpendicular to the first direction; and first through fifth through vias, extending through the substrate and along a third direction perpendicular to the first direction and the second direction, wherein the first through via is over the fifth rail and between the first rail and the second rail;

the second through via is over the fifth rail and between the third rail and the fourth rail, wherein the second through via is immediately neighboring to the first through via along the fifth rail;

the third through via is over the sixth rail and between the first rail and the second rail, wherein the third through via is immediately neighboring to the first through via along the first rail and the second rail;

the fourth through via is over the sixth rail and between the third rail and the fourth rail, wherein the fourth through via is immediately neighboring to the second through via along the third rail and the fourth rail, and immediately neighboring to the third through via along the sixth rail; and the fifth through via is inside a quadrilateral having, at corners thereof, the first through fourth through vias.

9. The semiconductor device of claim 8, further comprising first through fifth conductive wires on which the first through fifth through vias are correspondingly disposed.

10. The semiconductor device of claim 9, wherein the first conductive wire, the second conductive wire, the third conductive wire, the fourth conductive wire and the fifth conductive wire extend along the first direction.

11. The semiconductor device of claim 9, further comprising:

a first conductive via, disposed between the first conductive wire and the fifth rail;

a second conductive via, disposed between the second conductive wire and the fifth rail;

a third conductive via, disposed between the third conductive wire and the sixth rail;

a fourth conductive via, disposed between the fourth conductive wire and the sixth rail; and a fifth conductive via, disposed on the fifth conductive wire.

12. The semiconductor device of claim 11, wherein the first through via is aligned with the first conductive via along the third direction, the second through via is aligned with the second conductive via along the third direction, the third through via is aligned with the third conductive via along the third direction, the fourth through via is aligned with the fourth conductive via along the third direction, and the fifth through via is aligned with the fifth conductive via along the third direction.

13. The semiconductor device of claim 11, wherein the first through via is aligned, along the third direction, with an intersection of the first conductive wire and the fifth rail, the second through via is aligned, along the third direction, with an intersection of the second conductive wire and the fifth rail, the third through via is aligned, along the third direction, with an intersection of the third conductive wire and the sixth rail, and the fourth through via is aligned, along the third direction, with an intersection of the fourth conductive wire and the sixth rail.

14. The semiconductor device of claim 11, wherein the first through via, the fourth through via and the fifth through via are diagonally arranged with respect to the first direction and the second direction.

15. The semiconductor device of claim 11, wherein a width of the first through via or the third through via is equal to a pitch between the first and second rails.

16. A method of manufacturing a semiconductor device, the method comprising:

forming a through via penetrating a substrate including a first side and a second side opposite to the first side; and performing, at the second side of the substrate, deposition and patterning operations to form a first rail and a second rail extending along a first direction and spaced from each other in a second direction perpendicular to the first direction, form a conductive wire over the through via, between the first rail and the second rail, and extending along the first direction, wherein the conductive wire overlaps the first rail and the second rail when viewed along the second direction, and form a conductor electrically coupling the first rail to the conductive wire.

17. The method of claim 16, wherein along a third direction in which the through via penetrates the substrate, the first rail and the conductive wire are arranged between the through via and the conductor.

18. The method of claim 17, wherein said deposition and patterning operations further form a third rail over the first rail, the second rail and the conductive wire, the third rail extending along the second direction, the conductor is a bridging via which electrically couples the first rail to the third rail, and along the third direction in which the through via penetrates the substrate, the conductor is arranged between the third rail on one side, and the first rail and the conductive wire on an opposite side.

19. The method of claim 17, wherein the conductor extends continuously along the second direction from a first portion where the conductor overlaps the first rail in the third direction, to a second portion where the conductor overlaps the conductive wire in the third direction.

20. The method of claim 16, wherein the conductor overlaps the conductive wire, the first rail and the second rail when viewed along the second direction, and said deposition and patterning operations further form a conductive via over and coupled to the conductive wire, and a third rail over and coupled to the conductive via, the third rail extending along the second direction and physically spaced from the conductor along a third direction in which the through via penetrates the substrate and which is perpendicular to the first direction and the second direction.

* * * * *